United States Patent
Tzalenchuk et al.

(10) Patent No.: US 6,753,546 B2
(45) Date of Patent: Jun. 22, 2004

(54) TRILAYER HETEROSTRUCTURE JOSEPHSON JUNCTIONS

(75) Inventors: Alexander Ya. Tzalenchuk, Middlesex (GB); Zdravko G. Ivanov, Göteborg (SE); Miles F. H. Steininger, Vancouver (CA)

(73) Assignee: D-Wave Systems, Inc., Vancouver (CA)

( * ) Notice: Subject to any disclaimer, the term of this patent is extended or adjusted under 35 U.S.C. 154(b) by 0 days.

(21) Appl. No.: 10/231,385

(22) Filed: Aug. 29, 2002

(65) Prior Publication Data

US 2003/0042481 A1 Mar. 6, 2003

Related U.S. Application Data

(63) Continuation-in-part of application No. 10/006,787, filed on Dec. 6, 2001, now abandoned.
(60) Provisional application No. 60/316,134, filed on Aug. 29, 2001.

(51) Int. Cl.[7] .............................................. H01L 29/06
(52) U.S. Cl. ........................................................ 257/31
(58) Field of Search .............................. 257/31, 32, 33, 257/34, 35, 36

(56) References Cited

U.S. PATENT DOCUMENTS

| | | |
|---|---|---|
| 4,454,522 A | 6/1984 | de Lozanne |
| 4,490,733 A | 12/1984 | Kroger |
| 5,087,605 A * | 2/1992 | Hegde et al. .................. 505/1 |
| 5,250,817 A | 10/1993 | Fink |
| 5,274,249 A | 12/1993 | Xi et al. |
| 5,627,139 A | 5/1997 | Chin et al. |
| 5,776,863 A | 7/1998 | Silver |
| 5,892,243 A | 4/1999 | Chan |
| 5,962,866 A | 10/1999 | DiIorio et al. |
| 6,023,072 A | 2/2000 | Silver |
| 6,188,919 B1 | 2/2001 | LaGraff et al. |
| 6,459,097 B1 | 10/2002 | Zagoskin |
| 6,563,311 B2 | 5/2003 | Zagoskin |
| 2002/0188578 A1 | 12/2002 | Amin |
| 2003/0107033 A1 * | 6/2003 | Tzalenchuk et al. .......... 257/31 |

FOREIGN PATENT DOCUMENTS

WO      02/01327      11/2003

OTHER PUBLICATIONS

U.S. patent application Ser. No. 60/316,134, Zagoskin, filed Aug. 29, 2001.

Barone, A., and G. Paternò, "Physics and Applications of the Josephson Effect", John Wiley & Sons, New York, chapter 1 (1982).

(List continued on next page.)

Primary Examiner—Sara Crane
(74) Attorney, Agent, or Firm—Jones Day; Brett Lovejoy

(57) ABSTRACT

The present invention comprises a junction between an unconventional superconductor, an intermediate material, and a conventional superconducting material. In some embodiments, the unconventional superconductor has an orthorhombic crystal structure and the supercurrent in the resulting junction flows in the c-axis direction of the orthorhombic crystal. In other embodiments, the supercurrent flows parallel to a direction in the a-b plane. Interface junctions according to embodiments of the present invention may be used in superconducting low inductance qubits (SLIQs) and in permanent readout superconducting qubits (PRSQs), can form the basis of quantum registers, and can permit parity keys or other devices made from conventional superconducting material to be attached to qubits made from unconventional superconducting material or vice versa. Coherent tunnel junctions according to embodiments of the present invention may be used to form parity keys or to coherently couple two regions of a superconducting material.

42 Claims, 25 Drawing Sheets

OTHER PUBLICATIONS

Blatter, G., V.B. Geshkenbein, and L.B. Ioffe, "Design aspects of superconducting–phase quantum bits", Phys. Rev. B 63, pp. 174511–1 to 174511–9 (2001).

Born, D., T. Wagner, W. Krech, U. Hüber, and L. Fritzsch, "Fabrication of Ultrasmall Tunnel Junctions by Electron Beam Direct–Writing", IEEE Trans. App. Supercon 11, pp. 373–376, (2001).

Bruder, C., A.V. Otterlo, and G.T. Zimanyi, "Tunnel junctions of unconventional superconductors", Phys. Rev. B 51, pp. 12904–12907 (1995).

Chan, S.–W., L. Zhao, C. Chen, Q. Li, and D.B. Fenner, "Interface between gold and superconducting $YBa_2Cu_3O_{7-x}$", J. Mater. Res. 10, pp. 2428–2432 (1995).

Cucolo, A.M., R. Di Leo, A. Nigro, P. Romano, and F. Bobba., "Linear normal conductance in copper oxide tunnel junctions", Phys. Rev. B 54, pp. R9686–9688 (1996).

Dagan, Y., A. Kohen, and G. Deutscher, "C–axis tunneling on YBCO films", Eur. Phys. J. B 19, pp. 353–356 (2001).

Dagan, Y., A. Kohen, G. Deutscher, and A. Revcolevschi, "Absence of Andreev reflections and Andreev bound states above the critical temperature", Phys. Rev. B 61, pp. 7012–7016 (2000).

Grabert, H., and G.–L. Ingold, "Mesoscopic Josephson effect", Superlattices and Microstructures 25, pp. 915–923 (1999).

Iguchi, I., and Z. Wen, "Experimental evidence for a d–wave pairing state in $YBa_2Cu_3O_{7-y}$ from a study of $YBa_2Cu_3O_{7-y}$/insulator/Pb Josephson tunnel junctions", Phys. Rev. B 49, pp. 12388–12391 (1994).

Il'ichev, E., V. Zakosarenko, V. Schultze, H. E. Hoenig, H.–G. Meyer, K. O. Subke, H. Burkhardt, and M. Schilling, "Current–phase relationship of $YBa_2Cu_3O_{7-x}$ ramp–edge Josephson junctions", Appl. Phys. Lett. 76, pp. 100–102 (2000).

Joyez, P., P. Lafarge, A. Filipè, D. Esteve, and M.H. Devoret, "Observation of Parity–Induced Suppression of Josephson Tunneling in the Superconducting Single Electron Transistor", Phys. Rev., Lett. 72, pp. 2458–2461 (1994).

Kouznetsov, A., A. G. Sun, B. Chen, A. S. Katz, S. R. Bahcall, J. Clarke, R. C. Dynes, D. A. Gajewski, S. H. Han, M. B. Maple, J. Giapintzakis, J.–T. Kim, and D. M. Ginsberg, "c–axis Josephson Tunneling between $YBa_2Cu_3O_{7-\delta}$ and Pb: Direct Evidence for Mixed Order Parameter Symmetry in a High–$T_c$ Superconductor", Phys. Rev. Lett. 79, 3050–3053 (1997).

Krupke, R., Z. Barkay, and G. Deutscher, "A systematic approach to reduce macroscopic defects in c–axis oriented YBCO films", Physica C 315, pp. 99–106 (1999).

Kubatkin, S.E., A. Ya. Tzalenchuk, Z. G. Ivanov, P. Delsing, R. I. Shekhter, and T. Claeson, "Coulomb blockade electrometer with a high–$T_c$ island" JETP Letters 63, pp. 126–132 (1996).

Larsson, P., A.Y. Tzalenchuk, and Z.G. Ivanov., "Transport properties of submicron $YBa_2Cu_3O_{7-d}$ step–edge Josephson junctions", J. Appl. Phys. 90, p. 3450 (2001).

Larsson, P., B. Nilsson, and Z.G. Ivanov, "Fabrication and transport measurements of $YBa_2Cu_3O_{7-x}$ nanostructures", J. Vac. Sci. Technol. B 18, 25–31, (2000).

F. Lombardi, A. Ya. Tzalenchuk, S.E..Kubatkin, F. Tafuri, Z.G. Ivanov, P. Delsing, T. Claeson, "Tunnel barriers for an all–high–$T_c$ single electron tunneling transistor", Physica C 368, pp. 337–342 (2002).

Makhlin, Y., G. Schön, and A. Shnirman, "Quantum–State Engineering with Josephson–Junction Devices", Rev. Mod. Phys. 73, pp. 357–400, (2001).

Martens, J.S., G.K.G. Hohenwarter, J.B. Beyer, J.E., Nordman, and D.S. Ginley, "Sparameter measurements on singe superconducting thin–film three–terminal devices made of high–$T_c$ and low–$T_c$ materials", J. Appl. Phys. 65, pp. 4057–4060 (1989).

Matveev, K. A., M. Gisselfält, L. I. Glazman, M. Jonson, and R. I. Shekhter, "Parity–Induced Suppression of the Coulomb Blockade of Josephson Tunneling", Phys. Rev. Lett. 70, 2940–2943 (1993).

Mooij, J.E., T.P. Orlando, L. Levitov, L. Tian, C.H. van der Wal, and S. Lloyd, "Josephson Persistent–Current Qubit", Science 285, 1036–1039 (1999).

Nicoletti, S., H. Moriceau, J.C. Villegier, D. Chateigner, B. Bourgeaux, C. Cabanel, and J.Y. Laval, "Bi–epitaxial YBCO grain boundary Josephson junctions on $SrTiO_3$ and sapphire substrates", Physica C 269, pp. 255–267 (1996).

Racah, D., and G. Deutscher, "Properties of normal metal/dielectric/high–$T_c$ junctions obtained by in–situ oxidation", Physica C 263, pp. 218–224 (1996).

Schrieffer, J. R., and M. Tinkham, "Superconductivity", Rev. Mod. Phys., 71, pp. S313–S317, (1999).

Schulz, R.R., B. Chesca, B. Goetz, C.W. Schneider, A. Schmehl, H. Bielefeldt, H. Hilgenkamp, J. Mannhart, and C.C. Tsuei, "Design and realization of an all d–wave dc π–superconducting quantum interference device", Appl. Phys. Lett. 76, pp. 912–914 (2000).

Sigrist, M., and T.M. Rice, "Unusual paramagnetic phenomena in granula high–temperature superconductors–A consequence of d–wave pairing?", Rev. Mod. Phys. 67, pp. 503–513 (1995).

Smilde, H.J.H., D.H.A. Blank, G.J. Gerritsma, and H. Rogalla, "On the combination of $YBa_2Cu_3O_{7-d}$ and niobium technology: Material and electrical interface characterization", Inst. Phys. Conf. Ser. No 167, pp. 193–196 (1999).

Smilde, H.J.H., H. Hilgenkamp, G.J. Gerritsma, D.H.A. Blank, and H. Rogalla, "Y–Ba–Cu–O / Au / Nb Ramp–type Josephson Junctions", IEEE Trans, Appl. Supercond. 11, pp. 501–504 (2001).

Sun, A.G., A. Truscott, A.S. Katz, R.C. Dynes, B.W. Veal, and C. Gu, "Direction of tunneling in Pb/ I /$YBa_2Cu_3O_{7-x}$ tunnel junctions", Phys Rev B 54, pp. 6734–6741 (1996).

Tsuei, C.C., and J.R. Kirtley, "Pairing symmetry in cuprate superconductors", Rev. Mod. Phys. 72, p. 969–1016 (2000).

Valles, Jr., J.M., R.C. Dynes, A.M. Cucolo, M. Gurvitch, L.F. Schneemeyer, J.P. Garno, and J.V. Waszczak, "Electron tunneling into single crystals of $YBa_2Cu_3O_{7-\delta}$", Phys. Rev. B 44, pp. 11986–11996 (1991).

Van Harlingen, D.J., "Phase–sensitive tests of the symmetry of the pairing state in the high–temperature superconductors–Evidence for $d_{x^2-y^2}$ symmetry", Rev. Mod. Phys. 67, pp. 515–537 (1995).

Wollman, D.A., D.J. Van Harlingen, J. Giapintzakis, and D.M. Ginsberg, "Evidence for $d_{x^2-y^2}$ Pairing from the Magnetic Field Modulation of $YBa_2Cu_3O_7$–Pb Josephson Junctions", Phys. Rev. Lett 74, pp. 797–800 (1995).

Hunt, D.B. et al. 1982 "NbN/MgO/NbN edge–geometry tunnel junctions", Applied Physics Letters 55, 81–83.

Voss, M. et al. 1993 "Submicron Nb–Al–oxide–Nb junctions for frequency mixers", Superconductor Science and Technology 6, 373–377.

J.G. Wen, et al. 1995 "Microstructure of ramp–edge $Yba_2Cu_3O_3$/$PrBa_2Cu_3O_2$ Josephson junctions on different substrates", Physica C 255, 293–305.

* cited by examiner

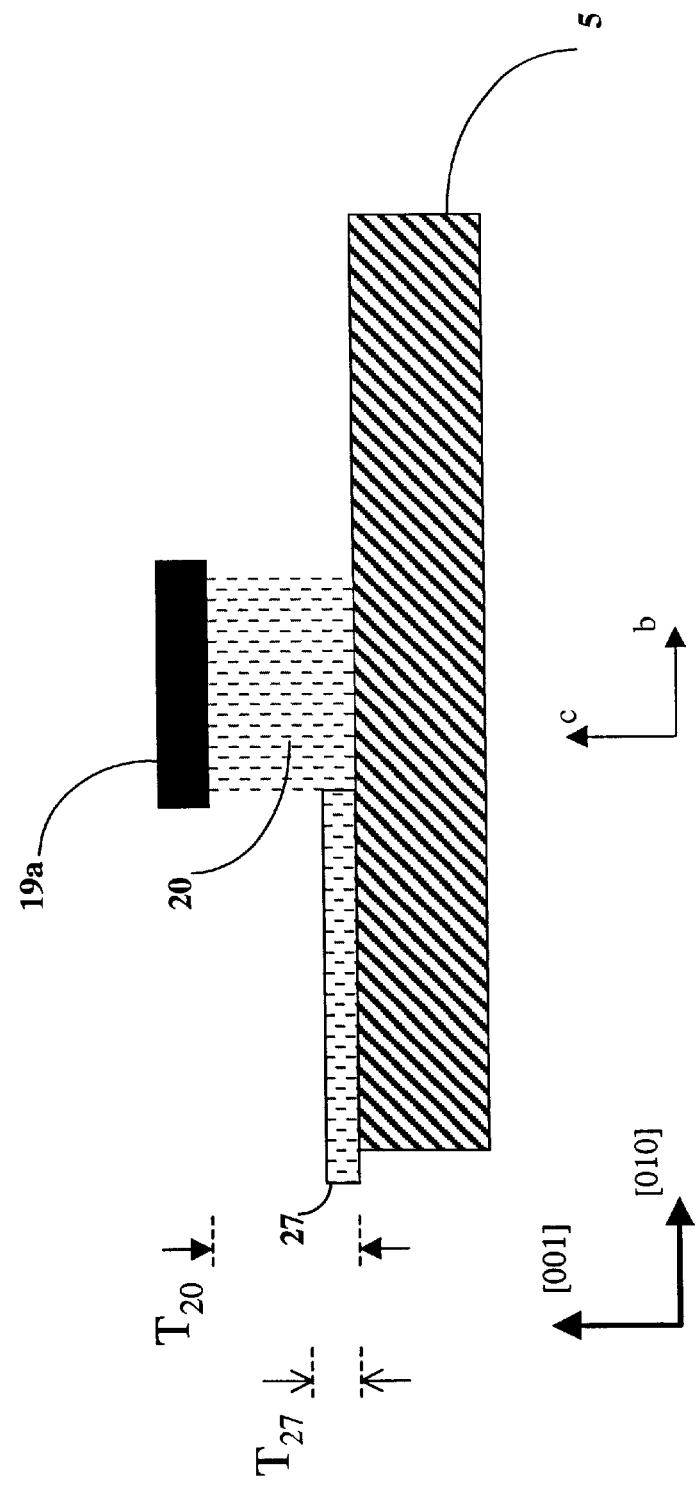

TRILAYER HETEROSTRUCTURE JOSEPHSON JUNCTIONS

CROSS-REFERENCE TO RELATED APPLICATIONS

This application claims priority to U.S. provisional application serial No. 60/316,134, filed Aug. 29, 2001, and to U.S. application Ser. No. 10/006,787, filed Dec. 6, 2001, now abandoned both of which are incorporated herein by reference in their entirety, and is a continuation-in-part of Ser. No. 10/006,787 filed Dec. 6, 2001 now abandoned.

FIELD OF THE INVENTION

This invention relates to structures that have quantum coherence, such as Josephson junctions, and more particularly to their application in superconducting quantum computing.

BACKGROUND

The quantum computer is rapidly evolving from a wholly theoretical idea to a physical device that will have a profound impact on the computing of tomorrow. A quantum computer differs principally from a conventional, semiconductor chip-based computer, in that the basic element of storage is a "quantum bit", or "qubit". A qubit is a creature of the quantum world: it can exist in a superposition of two states and can thereby hold more information than the binary bit that underpins conventional computing. One of the principal challenges in quantum computing is to establish an array of controllable qubits, so that large scale computing operations can be carried out. Although a number of different types of qubits have been created, it is believed that the practical realization of a large scale quantum computer is most likely to be achieved by harnessing the properties of superconducting junctions. It is in the superconducting regime that many materials display their underlying quantum behavior macroscopically, thereby offering the chance for manipulation of quantum states in a measurable way.

In 1962, Josephson proposed that non-dissipating current would flow from one superconductor to another through a thin insulating layer, see B. D. Josephson, *Phys. Lett.*, 1:251, (1962). Since then, the so-called Josephson effect has been verified experimentally and has spawned a number of important applications of superconducting materials. In particular, it has been found that the thin insulating layer originally used by Josephson is an example of a general class of barriers known as weak links. These weak links are interruptions of the translational symmetry of the bulk superconducting material on the same scale as the coherence length of the material. Examples of weak links include the following: grain boundaries, insulating gaps, tunneling junctions, constrictions, and any locations where the amplitude of the order parameter of the superconductor is diminished. The Josephson effect has been generalized to all weak links in a superconductor. Therefore any small interruption of a superconducting material, or an interface of two different superconductors, behaves as a Josephson junction. Avoiding the formation of weak links where Josephson junctions are not intended can make the fabrication of devices based on superconducting components difficult.

Nevertheless, the Josephson junction has found practical application in a device known as a superconducting quantum interference device (SQUID). The current and voltage of a superconducting loop with two small insulating gaps behaves in a previously unexpected way that depends on the magnetic flux enclosed in the loop. SQUIDs are useful for sensitive measurement and in the creation of magnetic fields. For example, see chapter 1 of A. Barone and G. Paternò, *Physics and Applications of the Josephson Effect*, John Wiley & Sons, New York, (1982), which is incorporated herein by reference.

Two types of superconductors are regularly used nowadays: conventional superconductors and unconventional superconductors. The most important phenomenological difference between the unconventional superconductors and conventional superconductors is in the orbital symmetry of the superconducting order parameter. In the unconventional superconductors, the pair potential changes sign depending on the direction of motion in momentum space. This has now been experimentally confirmed; see e.g., C. C. Tsuei and J. R. Kirtley, *Rev. Mod. Phys.*, 72, 969, (2000). The effects of this pairing were understood long before this experimental confirmation.

For example, it was discovered that in unconventional superconducting materials such as $YBa_2Cu_3O_x$ ("YBCO") that have orthorhombic crystal structures, there existed a significant subdominant order parameter mode that is spherical in momentum space (referred to as an s-wave); see K. A. Kouznetsov et al., *Phys. Rev. Lett.*, 79, 3050, (1997).

The coherence length of an unconventional superconductor is not isotropic. In an orthorhombic superconductor, the coherence length in the c-axis direction is much less than in the a and b directions. Correspondingly, the critical current is much smaller in the c-axis direction. Furthermore, the coherence length in all directions of an unconventional superconductor is small enough for a weak link to form easily at any junction. Given that the Josephson effect is present in all weak links, the short coherence length poses a difficulty for forming devices that utilize unconventional superconducting materials.

Hence, superconducting single electron transistors (SET's) have generally been made from conventional superconductors. Efforts to make them from unconventional superconducting materials have not been particularly successful. See, e.g., S. E. Kubatkin et al., *JETP Lett.*, 63, 126–132, (1996) and A. Tzalenchuk, poster presentation at SQUID 2001, both of which are incorporated herein by reference. The oscillations of a SET made from an unconventional superconducting material would have only a single charge periodicity, not both a single and a double charge period. Both effects are useful in superconducting quantum computing, where a mechanism for controllable switching of supercurrent is important and where the supercurrent charge carriers are Cooper pairs. Thus there is a need for a controllable supercurrent switch that is based on an unconventional superconductor.

Other types of junctions are known, but suffer from deficiencies that prevent their use in superconducting quantum computing. For example, Racah et al., *Physica C,* 263, 218–224, (1996), incorporated herein by reference, teach a junction comprising: YBCO, aluminum oxide and silver, i.e., an unconventional superconductor and a normal metal, separated by an insulator. However, no Josephson effect (in which Cooper pairs tunnel) was observed in Racah et al.'s structures; instead only quasi-particle tunneling was found. Furthermore such a junction has a dimension on the order of tens of microns.

Furthermore, junctions known in the art are far larger in area than the mesoscopic devices to which they need to be attached. This is a severe limitation, as size is often an enabling feature in quantum computers built from superconducting material. Certain components must be mesoscopic. Therefore, to implement quantum computing structures, Josephson junctions between conventional and unconventional superconductors are necessary, and no junction in the prior art suffices.

SUMMARY OF THE INVENTION

In accordance with the present invention, a Josephson junction is presented. In some embodiments, the junction includes an unconventional superconductor, an intermediate material, and a conventional superconducting material. In some embodiments, the resulting junction is in the c-axis direction of an orthorhombic unconventional superconductor. Alternatively, the junction may be oriented so that supercurrent flows in a direction in the a-b plane. The junction may be oriented so that either the c-axis direction or a direction in the a-b plane are aligned with the rest of the junction.

The present invention involves a Josephson junction comprising, in sequence: a first superconducting material layer; an intermediate layer having a first area of overlap with the first superconducting material layer; and a second superconducting material layer having a second area of overlap with the intermediate layer; wherein an area of intersection of the first area of overlap and the second area of overlap is less than or equal to about 0.1 $\mu m^2$, and wherein the first superconducting material layer is in contact with a substrate. In a preferred embodiment, the first superconducting material is a crystalline material having a crystal structure with an a-axis, a b-axis, and a c-axis; such that the c-axis is normal to the substrate.

A Josephson junction according to the present invention may also be a ramp-type junction wherein a first surface of the first superconducting material is parallel with the substrate; and a second surface of the first superconducting material makes an angle of inclination of between 0° and 90° with a plane that is normal to the first surface, wherein the angle of inclination is measured in a sense exterior to said first superconducting material and wherein the first surface and the second surface share an edge.

The present invention also involves a superconducting structure comprising, in sequence: a substrate; a first superconducting material layer comprised of unconventional superconducting material and includes a first region and a second region wherein the first region is disjoint from the second region; an intermediate material layer; and a second superconducting material layer that includes an island, wherein the island has a first area of overlap with the first region and a second area of overlap with the second region of the first superconducting material layer; and wherein an electrode is capacitively coupled to the island so that supercurrent can flow coherently between the first region and the second region of the first superconducting material layer.

Josephson junctions according to embodiments of the present invention may be used in superconducting low inductance qubits (SLIQs) and in permanent readout superconducting qubits (PRSQs). They can form the basis of quantum registers, and can allow for parity keys or other devices made from conventional superconducting material to be efficiently coupled to qubits made from unconventional superconducting material. Further, embodiments of the invention may be applicable to any electronic device that utilizes a superconducting junction wherein coherent transport between unconventional superconductors is useful.

In some embodiments, an unconventional superconductor having non-zero angular momentum pairing is placed with its c-axis perpendicular to the substrate. A conventional superconductor having a dominant mode that has zero angular momentum pairing is placed above the unconventional superconductor. Another material such as a normal metal or an insulator separates the conventional and unconventional superconductors to form a heterostructure (or heterojunction) to which electrodes may be attached.

Multiple methods of fabrication are described. Relative sizes of physical parameters needed for operation are introduced. Different materials as intermediate layers are described. The usage of various embodiments of heterojunctions in quantum computing structures is outlined.

BRIEF DESCRIPTION OF THE DRAWINGS

FIGS. 2A–2D illustrate a method of fabricating a c-axis heterostructure as shown in FIG. 1A.

DETAILED DESCRIPTION

Figure 1A:
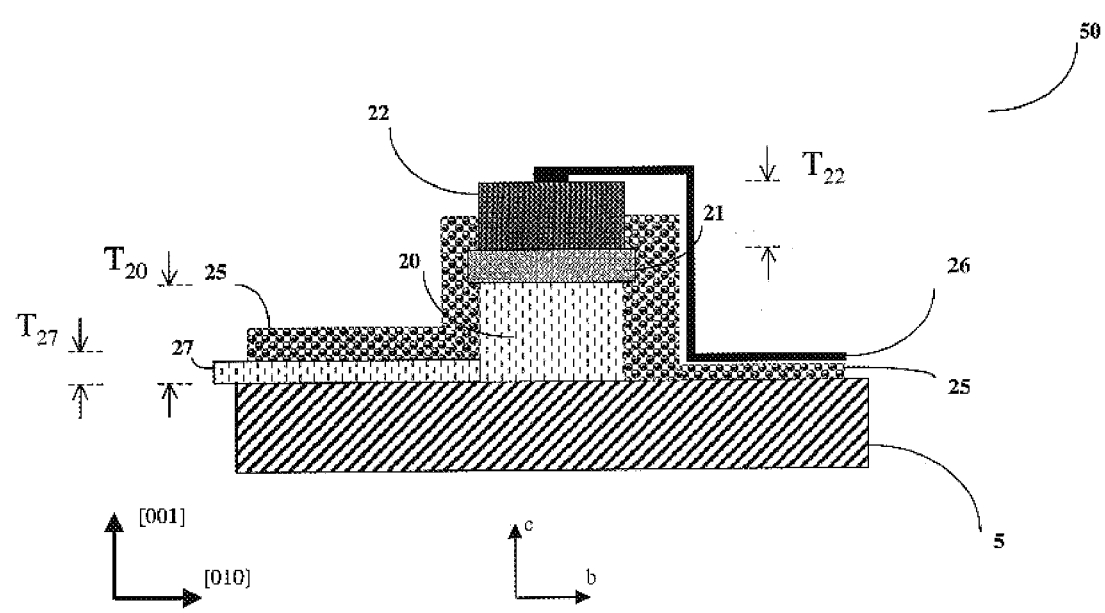
FIG. 1A illustrates a c-axis embodiment of the present invention.

The following terms are used herein with meanings that would be familiar to one of ordinary skill in the art of quantum computing, but a brief explanation is presented for the purpose of clarity. The reader is also referred to standard works of reference in the field, such as: *Quantum Computation and Quantum Information*, M. A. Nielsen, and I. L. Chuang, Cambridge University Press, (2000); *Scalable Quantum Computers—Paving the Way to Realization*, S. L. Braunstein and H.-K. Lo (eds), Wiley-VCH, (2001); and J. R. Schrieffer and M. Tinkham, "Superconductivity", *Reviews of Modern Physics*, 71(2), S313–S317, (1999).

Superconductor, or superconducting material: A material whose electrical resistance disappears completely. Most superconducting materials are only superconductors over narrow ranges of temperature, current, pressure, and magnetic field. Theoretically, a loop of superconducting material is able to support a flowing electric current for an infinite length of time. Although the earliest discovered superconductors were metals such as lead, mercury, tin, and aluminum, non-metals such as organic materials and ceramics have more recently been shown to be superconductors.

Superconductivity: the phenomenon whereby the electrical resistance of a material essentially vanishes, permitting unimpeded current flow. The most widely accepted explanation of superconductivity is Bardeen, Cooper, Schrieffer ("BCS") theory. According to this theory, resistance-free current flow arises from a coupling between the electrons and the crystal lattice: as the negatively charged electrons pass through the material, the crystal lattice, comprised of positively charged nuclei, deforms. Although variations of the basic theory have been proposed to account for superconductivity in different types of materials, the unifying principle is that electrons in a superconductor associate in pairs, known as Cooper pairs. Below the critical temperature, electrons near the Fermi energy that form Cooper pairs become separated in energy from unpaired electrons by a superconducting energy gap, $\Delta$. The energetic factors that normally disfavor electron pairing are offset by their interaction with the lattice and these electrons become carriers of supercurrent.

Mesoscopic: a class of solid systems of intermediate size, i.e., macroscopic but small enough (e.g., $\leq 1$ $\mu$m in each direction) to support discrete quantum states, and small enough that quantum interference is very important, since at low enough temperatures (e.g., <1K) the phase coherence length of quasiparticles ("electrons") exceeds the size of the system. See, A. Zagoskin, *Quantum Theory of Many Body Systems*, Springer, (1998), at page 19, citing Y. Imry, "Physics of Mesoscopic Systems", in *Directions in Condensed Matter Physics: Memorial Volume in Honor of Shang-Keng Ma*, G. Grinstein, G. Mazenko, eds., World Scientific, (1986).

Supercurrent: A current that flows in a superconductor. It may travel without an applied potential difference.

Critical temperature, $T_c$: A superconductor is characterized by a critical temperature, $T_c$, above which the material is not superconducting. Most metals that have a superconducting regime are referred to as "low-$T_c$" superconductors because they must be cooled to temperatures close to the absolute zero of temperature—often less than 1 K—before superconductivity is observed. Materials referred to as "high-$T_c$" superconductors need only be cooled to temperatures ranging from about 10 K to greater than 100 K before the onset of superconductivity.

Cooper pair: the basic unit of supercurrent in a superconductor is a pair of electrons that is coupled by weak interactions to lattice vibrations. The Cooper pair is central to BCS theory. Cooper pairs comprise long-range coupling of electrons, often across many unit cells, and superconductivity arises from the collective motion of many Cooper pairs. Electrons that form a Cooper pair are in a state that has a zero net momentum and zero net spin. The relative orbital angular momentum of the Cooper pair can have a value of zero (referred to as an "s-wave"), one (referred to as a "p-wave"), two (refered to as a "d-wave"), and so forth.

Critical Current: The critical current is the current, above which, a superconducting material is unable to support a supercurrent.

Unconventional superconductor: A superconducting material with either an anisotropic order parameter or one that violates time reversal symmetry. Examples include all non s-wave superconducting material, e.g., d-wave and p-wave materials such as $Bi_2Sr_2Ca_{n-1}Cu_nO_{2n+4}$, $Tl_2Ba_2CuO_{6+x}$, and $HgBa_2CuO_4$. $Sr_2RuO_4$ and the heavy fermion material $CeIrIn_5$ are also examples of unconventional superconductors. It has been found that most high temperature superconductors known at this time are unconventional.

Conventional superconductor: A superconducting material with an isotropic order parameter, i.e., an s-wave superconductor. Although most low temperature superconductors are conventional, a few are not. An example of a conventional superconductor is Aluminum.

Josephson junction: A Josephson junction comprises a pair of superconducting materials separated by a weak link, such that a non voltage current, i.e., supercurrent, flows across the link. A weak link is thought of as a region where the number of superconducting carriers, i.e., Cooper pairs is diminished. The weak link may be formed by a number of different means, including, principally: a thin layer of insulating material, across which charge carriers tunnel, giving rise to a "tunnel junction"; a normal non-superconducting, metal that is traversed by Cooper pairs; a grain boundary junction; a physical constriction formed by a point contact or an aperture; and a trench etched in, for example, a thin film of superconducting material. In general, then, a Josephson junction can be modelled as an interruption in the translational symmetry of a bulk of superconducting material. Typically, the interruption is on the order of the coherence length of the superconducting material. The Josephson junction has become a term of art applied to all structures which exhibit the Josephson effect.

Coulomb energy: The energy, $E_C=Q^2/2C$, to move charge Q on to an island with a total capacitance C.

Unit Cell: A crystalline material has a unit cell that defines the smallest repeating unit from which, through translational symmetry operations, the crystal can be described. The unit cell is described by 3 lattice vectors, each of which defines a fixed direction within the crystal, and the angles that those lattice vectors make with respect to each other. Each lattice vector has an associated length, denoted a, b, and c, that corresponds to the length of the side of the unit cell in a direction parallel to the lattice vector. The three lattice vectors may also be denoted by, respectively, [100], [010] and [001] unit vectors. Unit cells fall within one of seven crystal systems, known as monoclinic, triclinic, rhombohedral, orthorhombic, tetragonal, cubic and hexagonal.

Orthorhombic: A crystalline material is in the orthorhombic crystal system if the a-, b-, and c-axes of its unit cell are mutually orthogonal, and if the lattice parameters are such that $a \neq b \neq c$.

YBCO: A high temperature superconductor with a stoichiometry given generally by $YBa_2Cu_3O_{7-x}$ where x is a number between 0 and 1. When YBCO is referred to herein, it is assumed that any material within the family of compounds that correspond to values of x between 0 and 1 can be used. The crystal structure of YBCO is orthorhombic, but the a- and b-lattice parameters are about the same length while the c-lattice parameter is longer. Typically, the coherence length in the direction of the a- and b-axis is longer than in the c-axis direction. Correspondingly, the critical current in the c-axis direction is lower than that in other directions. The order parameter in the c-axis direction is a subdominant order parameter of YBCO and is s-wave versus d-wave for a-axis and b-axis.

Coherence Length: The coherence length can be thought of as the "size" of a Cooper pair and represents the shortest distance over which superconductivity can be established in a material. Coherence lengths are typically on the order of 1,000 Å, though they can be as small as 30 Å in superconducting copper oxides.

Quasi-particle: A bare (normal) particle that is "surrounded" by a cloud of other particles. Quasi-particles behave similarly to bare particles, but usually have a larger effective mass due to the cloud, which moderates their interactions with other particles.

Order parameter: This term is associated generally with phase transitions, wherein some property can be characterized as being zero or non-zero depending on the side of the transition. In the case of a superconductor, the transition between the non-superconducting state and the superconducting state can be considered to be a phase transition. According to Ginzburg Landau theory, an early theory of superconductivity, the number density of superconducting charges is expressed as the amplitude of a quantity, $\Psi$, that resembles a wavefunction. For an s-wave material, the order parameter is given by the product of the superconducting energy, $\Delta$, and the phase of $\Psi$. The order parameter thus vanishes above the critical temperature.

Parity key: a parity key is a special form of a single-electron transistor (SET) in that it is superconducting. The parity key only passes Cooper pairs, and only at certain gate voltages. (See P. Joyez, et al., "Observation of Parity-Induced Suppression of Josephson Tunneling in the Superconducting Single Electron Transistor", *Physical Review Letters*, 72:2458–2461, (1994)).

Single electron Transistor (SET): An SET is a mesoscopic device that permits the study of prototypical non-collective behavior of electrons. An "island", whose dimensions are of the order of 1,000 Å, is constructed in a manner that a gate electrode can control the tunneling on and off the island. At low temperatures, the dimensions are sufficiently small that only a single particle at a time can tunnel on to the island. By tuning the operating parameters, a situation can arise in which exactly half an electron is on the island, thereby introducing a degeneracy with respect to the presence or absence of an electron on the island. If the island is superconducting, the charge carriers are Cooper pairs and a double elementary charge oscillation can be established.

Trilayer Heterostructure Junctions

In accordance with the present invention, Josephson junctions using conventional and unconventional superconductors are presented. In some embodiments, junctions according to the present invention may be interface junctions with good electrical contact between an unconventional and a conventional superconducting material wherein the interface is some intermediate material. Alternatively, junctions according to the present invention may be used to form coherent Josephson junctions comprised of heterostructures suitable for use in superconducting single electron transistors (SET's). Junctions in accordance with the present invention may have an intermediate material that separates the two superconductors. In some embodiments, the junctions have current flowing in the direction of the largest lattice vector (c) of one of the superconductors, which may be orthorhombic. Alternatively, the current can flow orthogonally to the c-direction, in the direction of the a-b plane. The junctions can be incorporated as part of, or appendages of, larger devices involving superconducting junctions, or devices based on superconducting effects, such as a qubit in a quantum computer, or a SQUID in a sensor or in metrology applications.

Embodiments of junctions according to the present invention can be made into tunnel junctions by the use of a dielectric layer as the intermediate layer separating the two superconductors. If the junction has high critical current it will be a standard Josephson junction. If the Coulomb energy is high, the junction can be used as the tunnel junction in a SET. The SET with parity effects was theoretically proposed by K. A. Matveev et al., *Phys. Rev. Lett.*, 70, 2946, (1993) which is incorporated herein by reference. Later the device was realized. See P. Joyez, et al., *Phys. Rev. Lett.*, 72:15, (1994), which is incorporated herein by reference, which describes operation and manufacture of one type of single electron transistor.

Figure 1B:
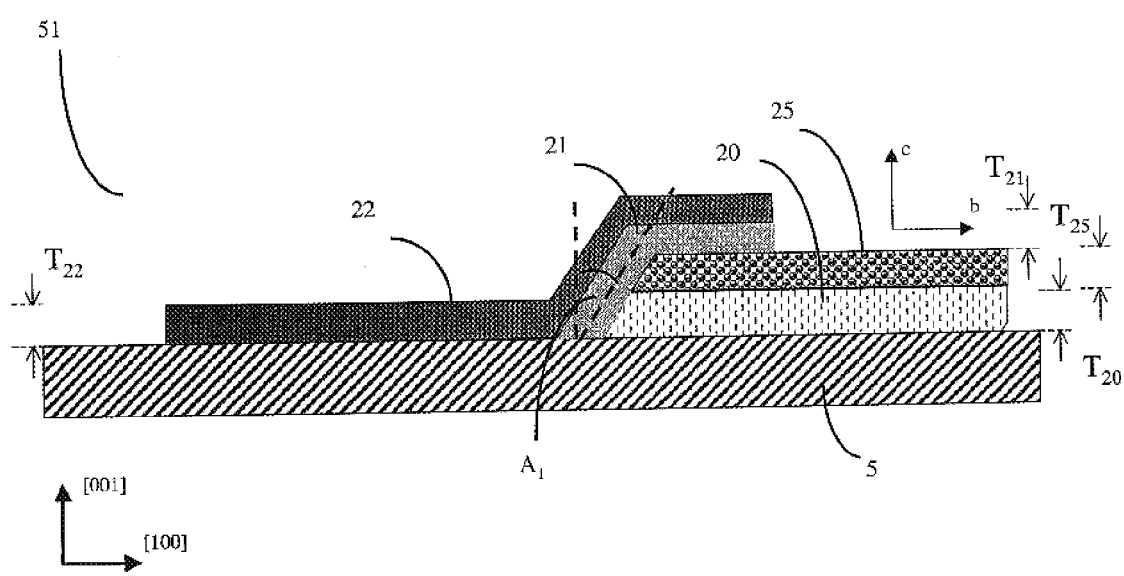
FIG. 1B illustrates an a-b plane embodiment of the present invention.
Figure 1C:
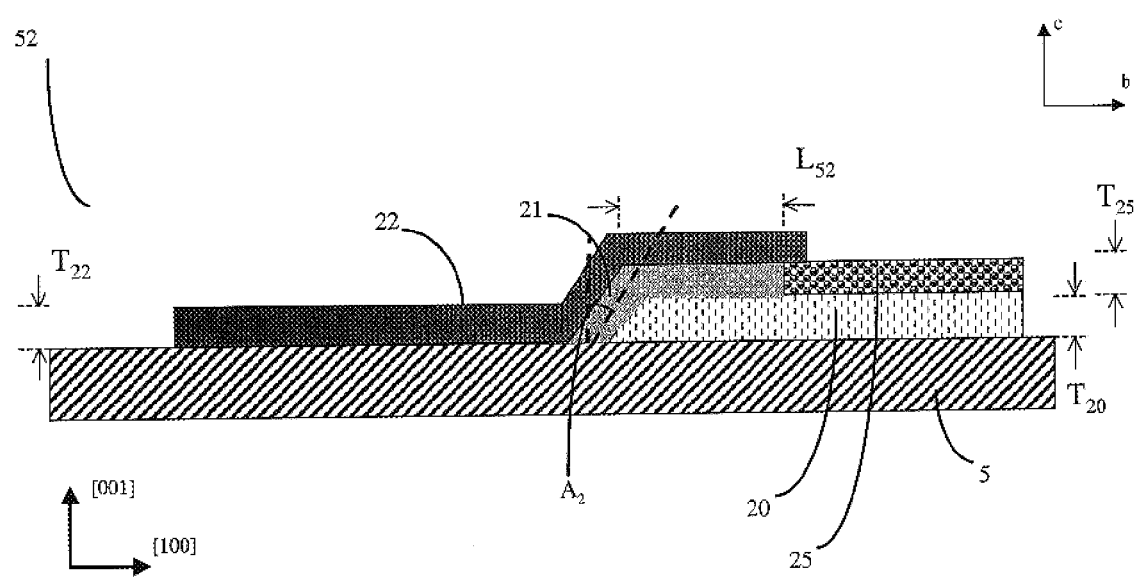
FIG. 1C illustrates a hybrid c-axis and a-b plane embodiment of the present invention.

FIGS. 1A–1C show representative embodiments of the present invention. A notation can be used, derived by traversing the heterostructure from the substrate outwards in the c-axis junction, or from right to left in the other embodiments, so that embodiments shown in FIGS. 1A–1C are referred to as a SND or a SID structure. The term "SND" is defined to be: s-wave/normal/d-wave, with the s-wave layer closest to the substrate. The term "SID" is defined to be: s-wave/insulator/d-wave, also with the s-wave layer closest to the substrate. In this invention a d-wave layer is not restricted to be a d-wave superconductor, but may be any unconventional superconductor defined hereinabove as having non-zero angular momentum pairing, and which will give rise to the same effect. Alternative embodiments of the invention can involve reversing the order of the two superconductor layers in the junctions shown in FIGS. 1A–1C. For an inverted trilayer the structure can be referred to as DNS or DIS.

FIG. 1A illustrates an embodiment of a junction according to the present invention where coupling occurs in the direction of the largest lattice vector (c-axis) of an orthorhombic unconventional superconductor. FIG. 1A shows a trilayer heterostructure 50, referred to as a c-axis trilayer. Substrate 5 may be, for example, an insulator such as MgO, LaAlO$_3$ or sapphire, or a conductor or semiconductor such as silicon covered with a suitable insulator.

An unconventional superconductor 20 is grown over substrate 5. Unconventional superconductor 20 may be an oxide with high oxygen mobility such as YBCO. Unconventional superconductor 20 may be, for example, a high T$_c$ cuprate such as, for example, YBa$_2$Cu$_3$O$_x$ ("YBCO").

On top of unconventional superconductor 20, an intermediate layer 21 of non-superconducting material, such as an insulating material or normal (non-superconducting) metal, for example gold, is deposited. Intermediate layer 21 as a first area of overlap with unconventional superconductor 20. Material 21 may be a conductor that is non superconducting at the operating parameters of the device or an insulator. The parameters of the junction depend on the embodiment of the invention, but layer 21 can consist of a normal metal such as gold (Au), silver (Ag), platinum (Pt), palladium (Pd) having a thickness T$_{21}$ less than about 20 nm. The thickness varies with coherence length of the superconductors or correlation length of the metal. In some embodiments, rather than a normal metal, intermediate layer 21 is an insulating material, the same as or different from insulating layer 25. Intermediate layer 21 may also comprise a semiconducting material such as silcon, or GaAs.

The third layer in the trilayer heterostructure is a conventional superconductor 22. Superconductor 22 may be a material with s-wave symmetry in the momentum space of its Cooper pairs. In some embodiments such a material can be lead (Pb), niobium (Nb) or aluminum (Al). Superconductor 22 can have thickness T$_{22}$ on the order of about 100 to about 300 nm. Superconductor 22 has a second area of overlap with intermediate layer 20, such that an area of intersection of the first and second area of overlaps is less than or equal to about 0.1 $\mu$m$^2$. In preferred embodiments, the area of intersection is between about 0.01 $\mu$m$^2$ and about 0.1 $\mu$m$^2$. In still other preferred embodiments, the area of intersection is mesoscopic in size. An exemplary area of intersection is formed from an area having a length of about 0.5 $\mu$m and a width of about 0.1 $\mu$m.

As illustrated in FIG. 1A, the conventional superconductor 22/intermediate material 21/unconventional superconductor 20 junction is oriented so that the direction of the c-axis of unconventional superconductor 20 is parallel to the direction of the supercurrent.

The consideration for selection of material may include the critical temperature $T_c$ of the material, its defect density when patterned and its affinity to chemically react with the surrounding material. An insulating layer 25 may cover portions of the structure. Insulating layer 25 electrically isolates unconventional superconductor 20 and conventional superconductor 22. The thickness of such a layer may be enough to reduce the stray tunneling amplitude between unconventional superconductor 20 and conventional superconductor 22 to a negligible level. Insulator 25 may have a thickness several times the largest coherence length of the two superconductors 20 and 22. Insulating layer 25 may be, for example, oxides of silicon or $SrTiO_3$.

Electrodes 26 and 27 connect to conventional superconductor 22 and unconventional superconductor 20 respectively.

Optionally, conventional superconductor 22 may be situated both adjacent to unconventional superconductor 20 and intermediate layer 21 and above them, so long as unconventional superconductor 20 and conventional superconductor 22 are not in contact. The thickness of insulating layer 25 is preferably large enough to reduce any stray tunneling amplitude between unconventional superconductor 20 and conventional superconductor 22 to a negligible level, generally about five to ten times the coherence length.

The coherence length is less for the c-axis than the a-axis or b-axis, thus for a given area, the transparency of junction 50 shown in FIG. 1A is less than the transparency of junction 51 shown in FIG. 1B. Transparency refers to the amount of superconducting current a junction is capable of supporting. Since the transparency of junction 50 of FIG. 1A is less than that of junction 51 of FIG. 1B, a junction with the geometry shown in FIG. 1A must be larger than a junction such as junction 51 shown in FIG. 1B to support the same amount of current.

FIGS. 1B and 1C illustrate exemplary ramp-type junctions. So called in the art, the ramp type junction was introduced by J. Gao et al., *Physica C*, 171, 126–130, (1990), which is incorporated herein by reference. Also related is the work of Smilde, et al., *IEEE Trans. Appl. Supercond.*, 11, 501–504 and the work of E. Il'ichev et al., *App. Phys. Lett.*, 76, 100–102, (2000), which are also incorporated herein by reference.

FIG. 1B illustrates an embodiment of the invention, a ramp type trilayer heterojunction 51, wherein the coupling occurs in a direction normal to the c-axis, in the a-b plane. As in FIG. 1A, an unconventional superconductor 20 is deposited on a substrate 5 with a first surface parallel to the surface of the substrate. Adjacent to unconventional superconductor 20 is intermediate layer 21, comprising a non-superconducting material such as an insulating material, a semiconductor, or a normal metal. Conventional fabrication techniques can create a junction so that a second face of unconventional superconductor 20 has an angle of inclination $A_1$ from a substrate normal that may be non zero, i.e., it is in the shape of a mesa. Angle $A_1$ depends on the etching process used to form the mesa, and the composition of superconductors 20 and 22. A preferred value for angle $A_1$ is about 30°, though any angle between 0° and 90° is contemplated. A perpendicular junction (i.e., where angle $A_1$ is zero) may also be formed, though junction 51 usually has a slight angle at $A_1$. A conventional superconductor 22 is placed on substrate 5, adjacent to layer 21. As illustrated in FIG. 1B, the conventional superconductor 22/intermediate material 21/unconventional superconductor 20 junction is oriented in the direction of the b-axis of unconventional superconductor 20, though it is to be understood that any axis in the ab-plane is suitable. This means that, in FIG. 1B, the direction of the supercurrent is parallel to the b-axis of unconventional superconductor 20, though, depending upon its orientation, the supercurrent may be parallel to another direction in the ab-plane of unconventional superconductor 20.

FIG. 1C illustrates a hybrid junction 52. Here both a-b plane and c-axis couplings exist, because superconductor 22 overlies portions of intermediate layer 21 and superconductor 20 in both the direction of the c-axis and a direction in the a-b plane. This structure is similar in structure, though not in function, to bistable Josephson junction structures disclosed in U.S. application Ser. No. 09/479,336, entitled "Qubit Using A Josephson Junction Between S-Wave and D-Wave Superconductors," which is incorporated herein by reference. The junction shown in FIG. 1C is optionally an interface junction (meaning intermediate layer 21 is a normal metal) or a tunnel junction (meaning intermediate layer 21 is an insulator). Like junctions 50 and 51 shown in FIGS. 1A and 1B respectively, junction 52 shown in FIG. 1C has an unconventional superconductor 20, an intermediate layer 21, and a conventional superconductor 22. Furthermore, junction 52 has an overlap of layers 21 and 22 onto unconventional superconductor 20. This overlap distance $W_{50}$ may be compared to height $T_{20}$ to estimate the relative coupling in each of the b- and c-directions, though the amount of coupling in each direction also depends on the transparencies of the junctions in each direction. By varying the amount of contact in each of the c- and b-directions, the type of coupling may be changed. However, as the b-(or a-) direction is more transparent than the c-direction, the ratio of the coupling is not equal to the ratio of the areas. The junction is at an angle $A_2$ with respect to the substrate normal. Angle $A_2$ may be zero.

In the embodiments illustrated in FIGS. 1A–1C, superconducting layer 20 may have a thickness $T_{20}$ on the order of about 75 nm to about 200 nm. Conventional superconductor 22 may have a thickness $T_{22}$ of about 100 to 300 nm. Junction 50 of FIG. 1A and junction 51 of FIG. 1B may be either SND, meaning that the intermediate layer is a normal metal, or SID, meaning that the intermediate layer is an insulating layer. In embodiments where intermediate layer 21 is a normal metal, intermediate layer 21 may have a thickness (not shown) less than about 20 nm. In embodiments where intermediate layer 21 is an insulating layer, intermediate layer 21 may have a thickness of a few nanometers to tens of nanometers.

Junctions 50, 51, and 52 of FIGS. 1A–1C respectively each have a length, which is the length of overlap of superconductors 20 and 22, in the planes of FIGS. 1A–1C. The width of junctions 50, 51, and 52 is the width of overlap of superconductors 20 and 22, perpendicular to the plane of FIGS. 1A–1C. Generally, the width of a junction is less than the junction's length. The area of junctions 50, 51, and 52 is simply the length multiplied by the width. In general, a c-axis junction such as that illustrated in FIG. 1A will have the largest area and an a-b plane junction such as that illustrated in FIG. 1B will have the smallest area. Hybrid junction 52 of FIG. 1C generally has an area less than a c-axis junction and greater than an a-b plane junction In some embodiments of junction 50 of FIG. 1A, the area may be between about 0.01 $\mu m^2$ and about 0.1 $\mu m^2$ (1 $\mu m^2 = 10^{-12}$ $m^2$). The length of junction 50 may be, for example, about 0.5 $\mu m$ and the width of junction 50 may be, for example, about 0.1 μm, yielding an area of about 0.05 μm². In junction 51 of FIG. 1B, the area may be between about 0.01 μm² and about 0.02 μm². The length of junction 51 may be, for example, about 0.2 μm and the width of junction 51 may be, for example, about 0.1 μm, yielding an area of about 0.02 μm².

For some embodiments, the quality of the junctions 50, 51 and 52, shown in FIGS. 1A–1C should be high. Particularly, the roughness of the material interfaces should be minimized. The smoother the interfaces, the harder it is for current to flow in directions other than the direction intended by the geometry of the junction. Further, given the anisotropy of the properties of many unconventional superconductors, the resistance of smooth junctions is greater. Roughness can be expressed as a comparison of the variation of surface height over a particular distance measured in the plane of the interface. Physical values of roughness for interfaces of the present invention are preferably an absolute variance of less than about 3 nm for elevations and depressions separated by hundreds of nanometers. Preferably also, the variation in elevation at any point in the surface does not exceed a few unit cells of a given material. Roughness typically depends on what method of fabrication is used and what form intermediate layer 21 takes. Especially in c-axis junctions 50, smoother layers yield junctions where the only coupling across the junction is the intended coupling.

The normal resistance of a SND junction may, in some embodiments of junctions 50, 51 and 52, be minimized. The resistance of an interface may measured by a quantity that is the product of the resistance and the area of the interface and thus provide a measure of the quality of the junction. For example, when superconductor 20 is YBCO, intermediate layer 21 is gold, and superconducting layer 22 is niobium, resistance in the YBCO/Nb interface may be about $10^{-2}$ Ωcm², and resistance in the Au/Nb interface may be about $10^{-6}$ cm². These values change with materials used in the examples and are preferably varied to minimize decoherence.

The critical current $I_c$ of a junction is the value above which the superconductor cannot sustain supercurrent. It is also the maximum current level in the DC Josephson effect. Exceeding the value of the critical current will introduce a resistive term (related to quasi particles) that will in embodiments of the invention included in superconducting qubits prevent a qubit from being in its intended superposition of states. The Josephson energy $E_J$ of the junction is proportional to $I_c$. In the creation of interface junctions, $I_c$ is preferably maximized. However it may not always be possible for $E_J$ to be maximized, because, depending on device parameters, the Josephson energy may not exceed a certain value. The value of the Josephson energy may be such that it is energetically favorable to have the phase of the order parameters on either side of the interface junction equal to one another.

For a Josephson junction, the distance between the two superconductors (i.e., the thickness of intermediate layer 21 in FIGS. 1A, 1B, 1C) cannot greatly exceed a certain length, or negligible current through the junction will result. Such a length is given by the thickness of layer 21 at its thinnest point, shown as $T_{21}$. The thickness $T_{21}$ and details of transport across layer 21 differ with material. The characteristic lengths of interest in the present invention, which are collectively called coherence lengths, have different names and values from one another. The coherence length, ξ, of the superconductor is important for insulating barriers, where tunneling is the current transport mechanism. In clean metallic weak links, the correlation length of the metal, given by $\hbar v_F/kT$, is the relevant quantity, where $v_F$ is the Fermi velocity, k the Boltzman constant and T is temperature. In dirty links, where the mechanism of current transmission across the junctions is by diffusion, the characteristic length is $\sqrt{\hbar D/kT}$, wherein D is an empirically derived diffusion coefficient.

When a junction is formed with an insulator as intermediate layer 21, the junction may have resistance that is high enough and capacitance that is low enough to create a tunnel junction. Capacitance is proportional to the dielectric constant of the insulator in layer 21, and area of the junction. Resistance is inversely proportional to area. Therefore reduction of junction scale would suffice; an area of approximately 0.05 μm² is appropriate for a c-axis junction. A smaller area is sufficient for other structures, as described hereinabove.

Methods of Fabrication

Embodiments of methods of fabricating the structures illustrated in FIGS. 1A–1C are illustrated below. FIGS. 2A–2D illustrate a method of fabricating a c-axis heterostructure as shown in FIG. 1A. FIGS. 2E–2G illustrate a method of fabricating any of the embodiments shown in FIGS. 1A–1C. FIGS. 2H–2J illustrate another method of fabricating a c-axis junction as shown in FIG. 1A. FIGS. 2K–2L illustrate a method of fabricating an a-b plane junction as shown in FIG. 1B and a hybrid heterostructure as shown in FIG. 1C.

The general tools and methods for depositing and patterning materials on a substrate are well known. One skilled in the art will recognize that tools and techniques other than those specifically discussed herein may be used to fabricate the structures shown in FIGS. 1A–1C. Any deposition and patterning methods that achieve the same resulting structure can be considered.

Etching creates a flat surface with a defined surface region that serves as an insulator for c-axis tunnel junctions. For example, J. M. Valles, Jr., et al., *Phys. Rev. B*, 44, 11986–11996, (1991), which is incorporated herein by reference, discuss methods of etching YBCO. YBCO crystals were etched "either in 10 mM $HClO_4$ and 1M $NaClO_4$ in water for 5–30 min., or in 1.0% Br (by volume) in methanol for 30–120 min." This yielded a smooth surface to which another material, such as a lead made from a conventional superconductor, can be attached. The surface of an unconventional superconductor often has non-stochiometric components and is locally depleted of oxygen.

In some embodiments, structures can be patterned using ion milling with anions or cations. This can be carried out with commercially available equipment. One such equipment is an Ar etching system produced by Sentech Instruments GmbH of Berlin, Germany.

Deposition of materials through effusion e.g., epitaxy, laser and thermal deposition, and sputtering, allows for layers to be built upon the substrate. Fabrication of submicron structures in High-$T_c$ superconducting materials are described in P. Larsson, B. Nilsson, and Z. G. Ivanov, *J. Vac. Sci. Technol. B*, 18, 25–31, (2000); P. Larsson, A. Y. Tzalenchuk, and Z. G. Ivanov, *J. Appl. Phys.* 90, 3450, (2001), both of which are incorporated by reference.

Photoresist masks are useful in some embodiments because they allow for precise placement of materials. Electromagnetic radiation lithography, and electron lithography can be used to shape the masks. Lithography is widely used in semiconductor manufacture and research. The ZBA e-beam series from Leica Microsystems AG of Wetzlar, Germany are suitable devices for some embodiments.

Optionally, fabrication may include an intermediate mask made from gold and carbon to pattern the unconventional superconductor or any other layer. Exemplary methods are detailed in *J. Vac. Sci. Technol. B,* 18, 25–31, (2000) and *J. Appl. Phys.,* 90, 3450, (2001) incorporated herein by reference. According to the method, the pattern is transferred by ion etching such as an argon beam at 400 eV and 0.1 mA/cm$^2$ for 75 min through a 150 nm-thick carbon mask. While etching, the substrate may be thermally anchored to a water-cooled plate to avoid heating and degeneration of the unconventional superconductor. The intermediate mask, such as a gold layer approximately 20 nm thick, covering the unconventional superconductor may be removed by about 7 minutes of argon ion-beam etching at 400 eV and 0.1 mA/cm$^2$. The intermediate mask may be patterned by the use of a photoresist described above.

Figure 2A:
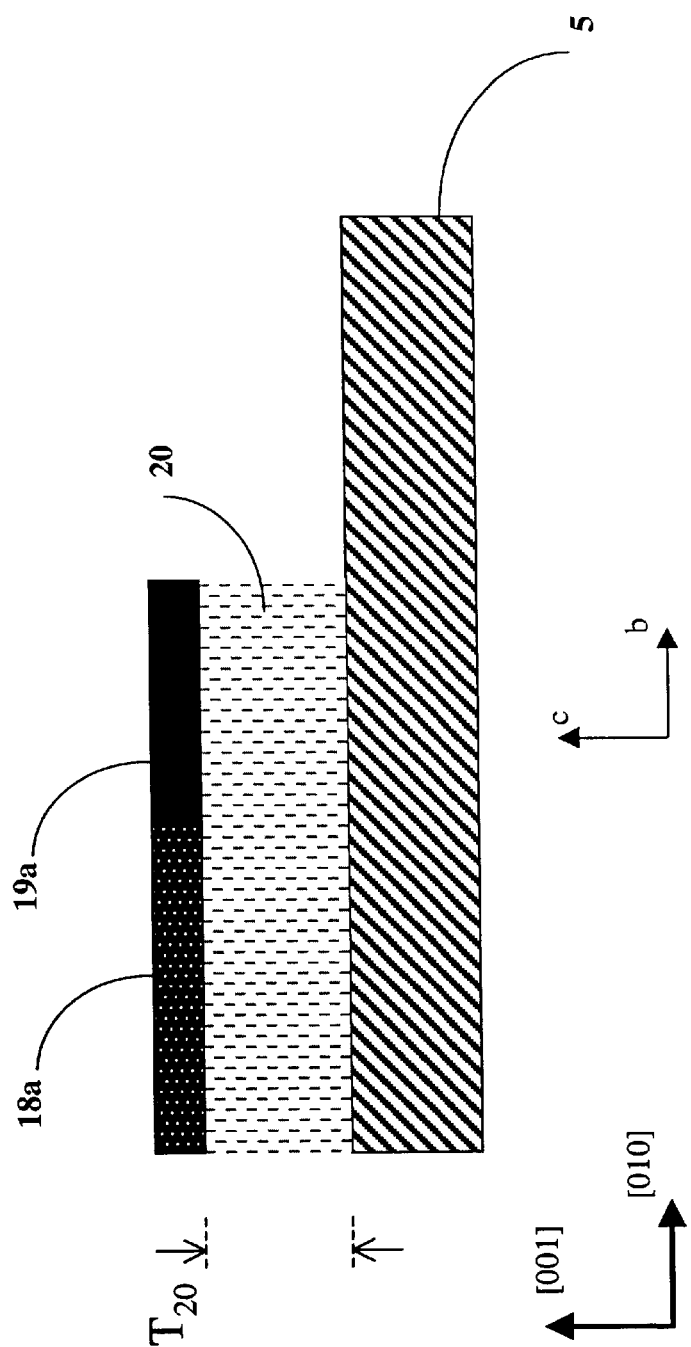
Figure 2C:
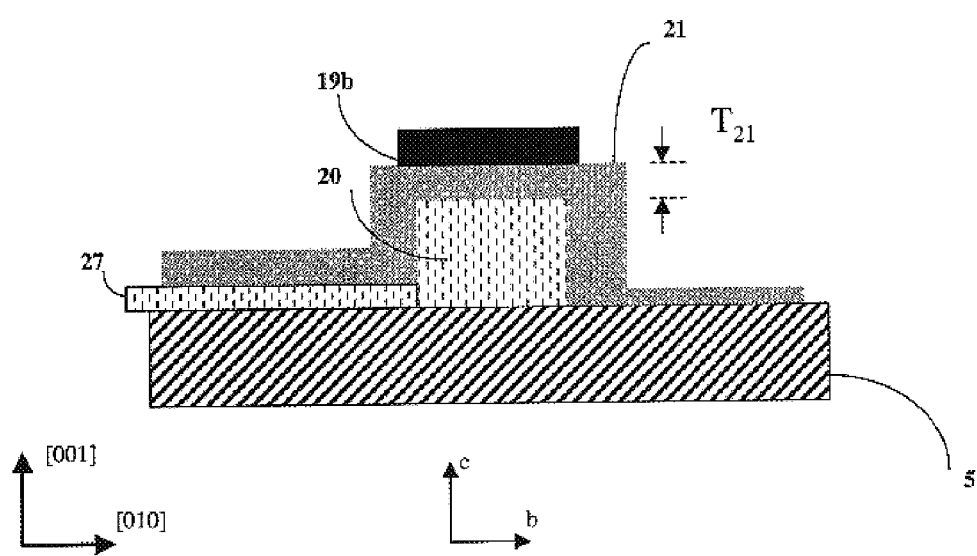
Figure 2D:
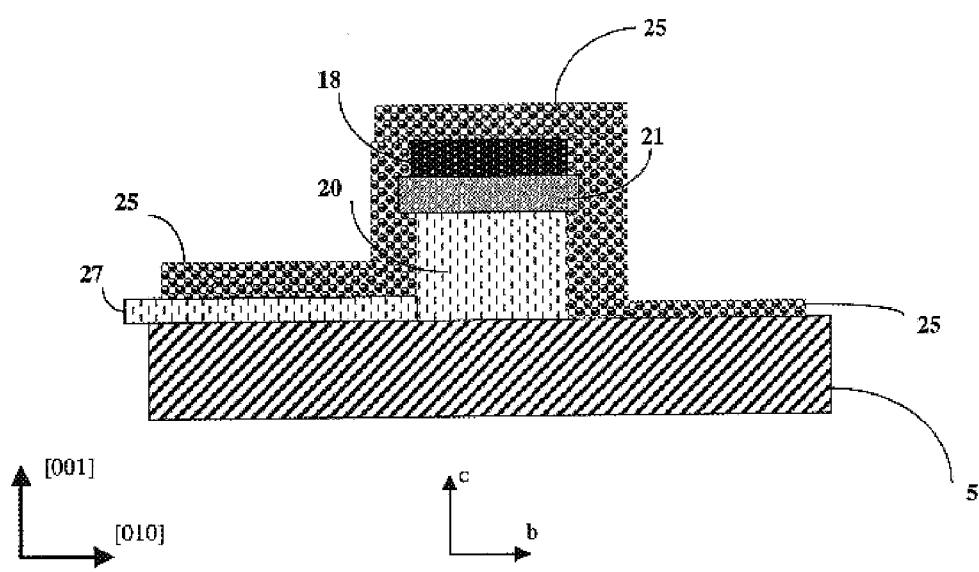
Figure 2E:
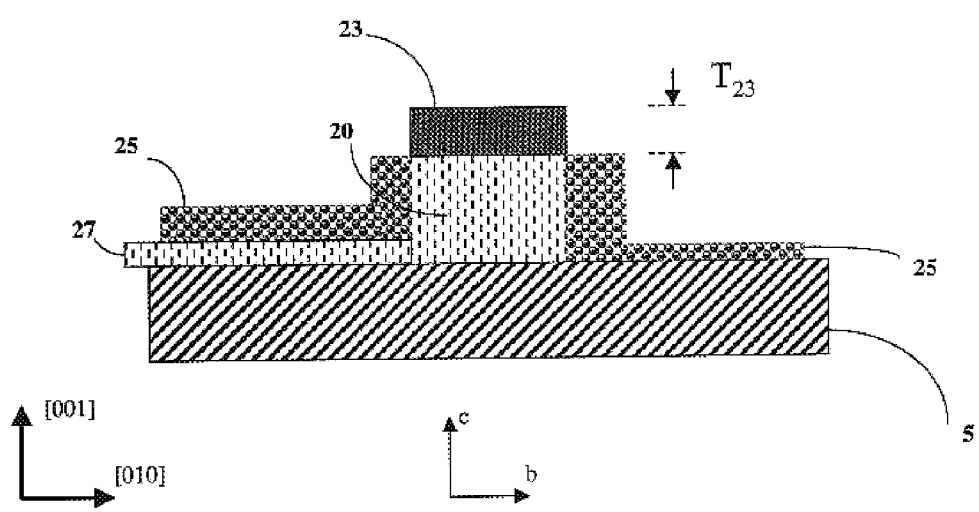
FIGS. 2E–2G illustrate a method of fabricating any of the embodiments shown in FIGS. 1A–1C.
Figure 2F:
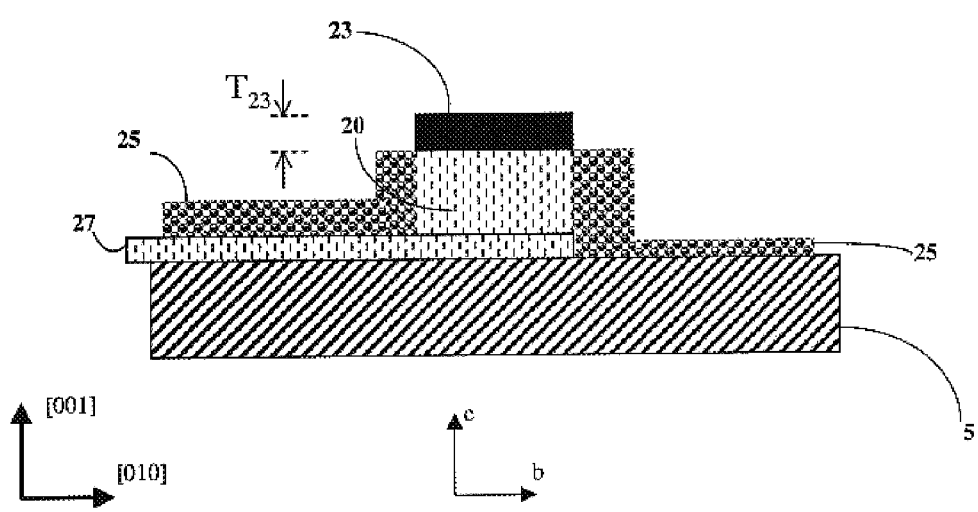
Figure 2G:
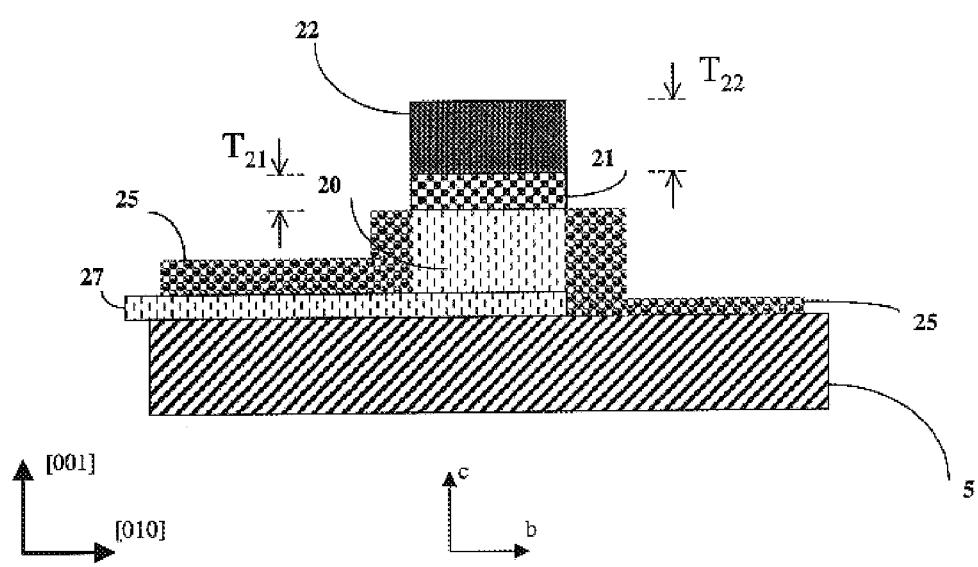
Figure 2H:
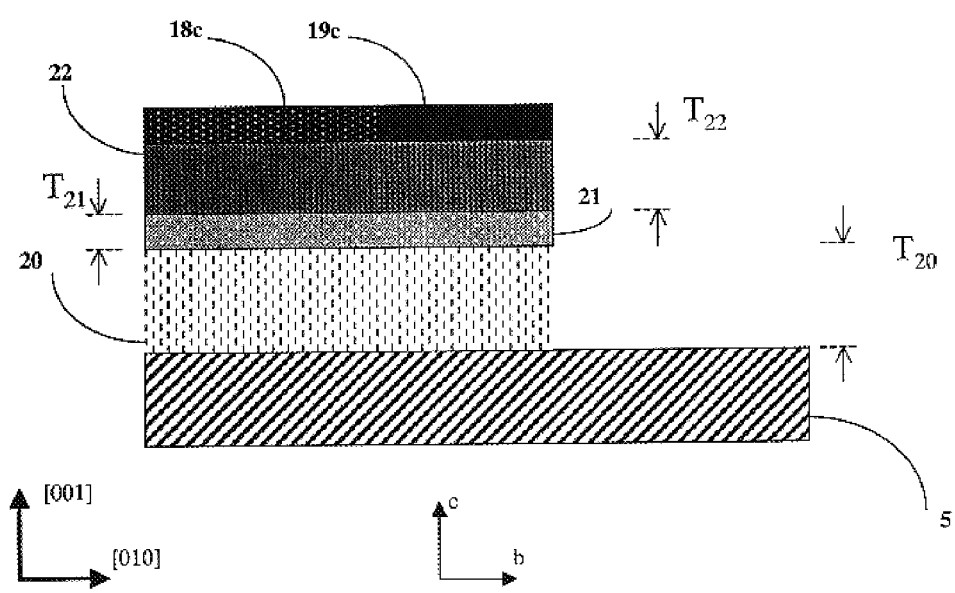
FIGS. 2H–2J illustrate another method of fabricating a c-axis junction as shown in FIG. 1A.
Figure 2I:
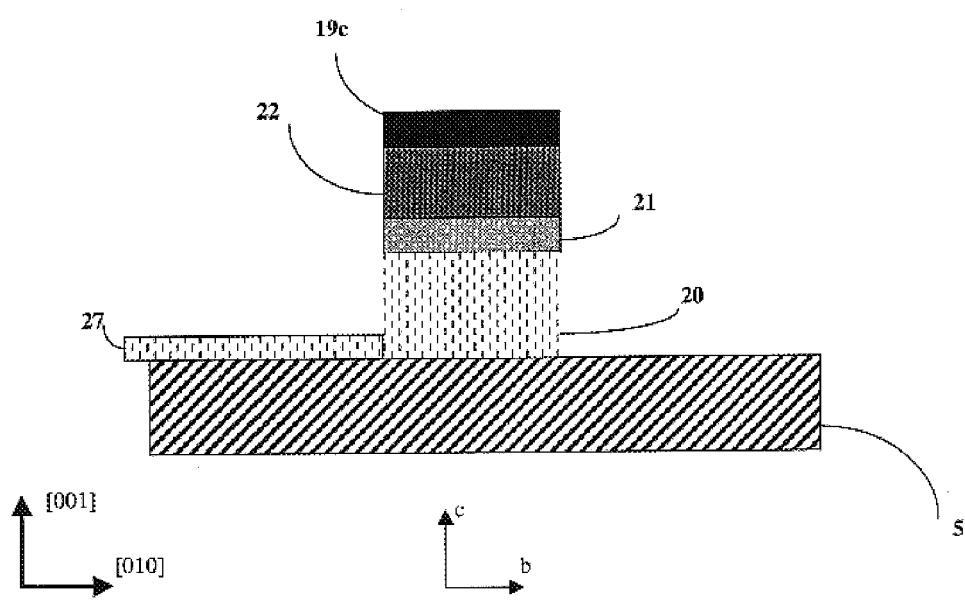
Figure 2J:
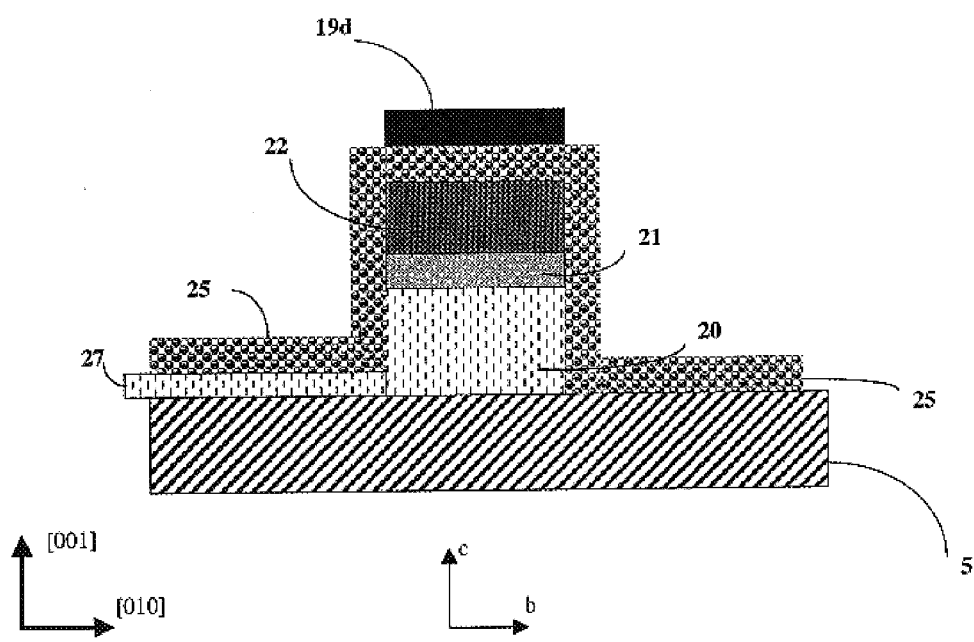
Figure 2K:
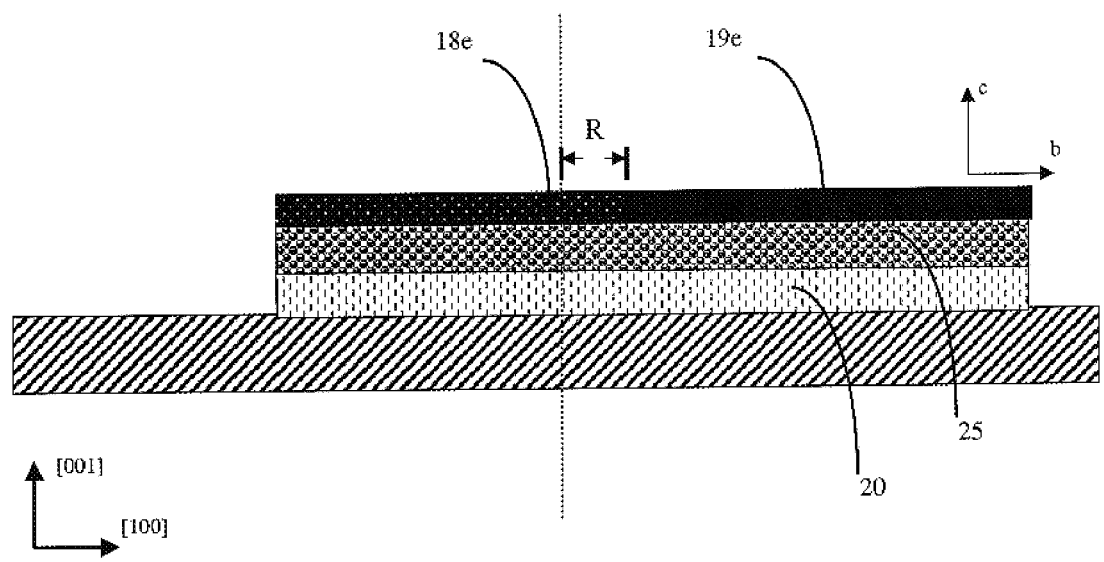
FIGS. 2K–2L illustrate a method of fabricating an a-b plane junction as shown in FIG. 1B and a hybrid heterostructure as shown in FIG. 1C.
Figure 2L:
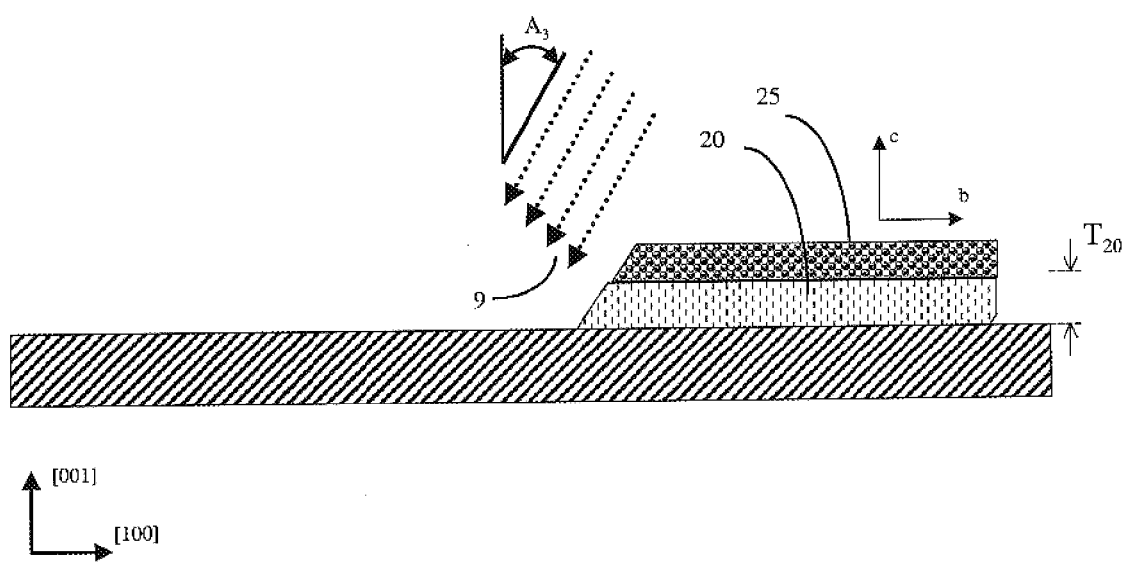

FIGS. 2A–2L show cross-sections of various junctions of the present invention in which layers are being successively deposited. Thus, FIGS. 2A–2L are described herein in conjunction with descriptions of processes for fabricating junctions shown in FIGS. 1A, 1B and 1C. Turning now to FIG. 2A, unconventional superconductor 20 is deposited on substrate 5. A layer of photoresist 18a and 19a is deposited over unconventional superconductor 20. Unconventional superconductor 20 may be patterned using the following well-known photolithography steps: application of photoresist layers 18a and 19a such as, for example, polymethylmethacrylate (PMMA), selective exposure by, for example, UV, X-ray, or electron beam, developing (thermally or chemically) which removes a portion 18a of the photoresist and fixes another portion 19a, of the photoresist. Either positive or negative photoresist may be used. Unconventional superconductor 20 may then be patterned by etching using, for example, a wet etch or a dry etch. The etching method used preferably should not degrade the shape of the material being patterned nor alter its properties. Portions of the unconventional superconductor 20 are protected by the fixed resist 19a.

In FIG. 2B the portion of unconventional superconductor 20 underlying photoresist layer 19a preferably remains at a constant height $T_{20}$. In some embodiments, unconventional superconductor 20 is deposited at a thickness $T_{20}$ on the order of about 100 nm to about 200 nm. The portion of the unconventional superconductor 20 formerly under photoresist layer 18a has been etched to thickness $T_{27}$. Photoresist layer 19a may then be removed. The material from which lead 27 is formed is deposited at the same time as unconventional superconductor 20 to create a contiguous piece of material (i.e., no junction). Lead 27 can have a thickness $T_{27}$ after patterning that is optionally less than $T_{20}$ and can be formed by, for example, the undercut resist lift off method which is known in the art, see e.g., Born et al., *IEEE Trans. Appl. Supercond.,* 11, 373–376, (2001), which is incorporated herein by reference.

In FIG. 2C, a normal material layer 21 is deposited, then patterned with a photoresist layer 19b, such as, for example, PMMA. Normal material 21 is patterned as shown in FIG. 2C. Normal material 21 is deposited on the entire structure, then photoresist 19b is fixed above a portion of normal material 21. Etching will create a bilayer, leaving only the portion of normal material 21 underlying photoresist layer 19b. Photoresist layer 19b may then be removed.

In some embodiments, an insulating layer 25, shown in FIG. 2D, is deposited over the structure shown in FIG. 2C. Insulating layer 25 may be deposited before or after the deposition of normal layer 21. Insulating layer 25 is patterned to expose a portion of intermediate layer 21, on which conventional superconductor (FIG. 1A) is deposited. Photoresist 18 is optionally left in place prior to depositing layer 25.

A second superconductor 22 may then be deposited and patterned to yield the structure shown in FIG. 1A. A lead 26 may be deposited on superconductor 22. Lead 26 can be of the same material as 22 or a different material, such as a normal metal. Lead 26 may be patterned at the same time as superconductor 22, or in separate etching steps.

FIGS. 2E–2G illustrate a method of fabrication that creates an insulator layer between unconventional superconductor 20 and conventional superconductor 22. This method can be used to create embodiments of the invention such as those shown in FIGS. 1A–1C and is similar to the method discussed in D. Racah et al., *Physica C* 263, 218–224, (1996), which is incorporated herein by reference in its entirety.

Referring now to FIG. 2E, an unconventional superconductor 20 is deposited on substrate 5 and patterned as described hereinabove in the text accompanying FIGS. 2A and 2B. A dielectric layer 25 may be deposited over unconventional superconductor 20 and patterned to expose a portion of unconventional superconductor 20.

As shown in FIG. 2F, above or adjacent to a smooth portion of unconventional superconductor 20, depending on the embodiment, a thin layer of oxygen receptor material 23, that is a material with strong electronegativity, is placed. Material 23 accepts oxygen and forms an oxide which becomes intermediate layer 21. In one example, material 23 is Al, which oxidizes to form an intermediate layer 21 of Aluminum oxide, $Al_2O_3$. In some embodiments, it may take tens of hours in a vacuum for layer 23 to spontaneously and completely oxidize. The natural oxygen mobility of oxide superconductors allows for the oxygen to diffuse in layer 23. Optionally, directly after the placement of material 23, a normal metal layer is deposited thereon. This ensures that material 23 is oxidized to form intermediate layer 21 via diffusion from superconductor 20 and not by contact with the sparse atmosphere, and also that it is not sloughed off during subsequent processing, as may happen with other methods. The thicker that layer 23 is made, the greater the reduction in oxygen content of superconductor 20. For a volume ratio of about 10:1 for (YBCO to Al) this results in a doping of about x=6.80 in $YBa_2Cu_3O_x$ in contrast to the optimal value of about x=6.94. If the bulk is under-doped, it can be corrected after manufacture by immersing the sample in an oxygen environment.

Furthermore, the thicker layer 23 is made, the lower the transparency of the junction, as given by the amount of current flowing across the junction, per unit area. The transparency can be further affected by introducing a thin noncontiguous layer of normal metal between layer 23 and unconventional superconductor 20.

In FIG. 2G, precursor layer 23 of FIG. 2F has oxidized to form intermediate layer 21 with thickness $T_{21}$. The thickness may be about a few nm to a few tens of nanometers. In the case of c-axis junctions, depositing and patterning a conventional superconductor 22 over intermediate material 21 yields a trilayer.

In some embodiments, a thin layer of non-contiguous normal metal is inserted between oxidized material 21 and unconventional superconductor 20. Prior to the deposition of oxygen receptor layer 23, a small amount of metal such as Ag is deposited with a thickness less than 7 nm. The use of such a metal layer may increase the transparency of the junction. This layer is preferably deposited in such a way that the material is imperfect, i.e., it has holes in it. The metal layer may also be deposited as a contiguous layer that is very thin but is without holes. Further, such a layer can be subjected to chemical treatment, as described by J. M. Valles, Jr. et al., cited hereinabove. Alternatively, chemical treatment may be applied to the surface prior to depositing the metal layer.

FIGS. 2H–2J illustrate yet another method of fabricating a c-axis junction such as that illustrated in FIG. 1A. An unpatterned deposited trilayer of first superconductor 20, intermediate material 21 and second superconductor 22 that has partial protection via a patterned and fixed resist 19c (shown in FIG. 2H) is etched by, for example, ion etching. In this embodiment, intermediate layer 21 may be a normal metal. The etching of the trilayer yields the elevation view of FIG. 2I. Note that the structure shown in FIG. 2I is part of the heterojunction 50 shown in FIG. 1A, except that the optional insulation 25 and the top electrode 26 are not shown. The attaching of electrodes can be accomplished by partially etching the first layer and using the reduced thin film as an electrode 27.

As shown in FIG. 2J, an insulating layer 25 may be placed directly on top of the structure shown in FIG. 2I, after photoresist 19c is stripped. A photoresist layer 19d is deposited and fixed to pattern the insulator 25. Cleaning of the sample may then remove photoresist 19d and a portion of insulator 25. Such a process produces a structure as shown in FIG. 1A, other than electrode 26. Top electrode 26 (as shown in FIG. 1A) can be attached via patterning means discussed above. However, the contact area may be free of impurities. Electrode 26 may be the same material as conventional superconductor 22 or a different material such as a normal metal. The resulting structure is then junction 50 as illustrated in FIG. 1A.

FIGS. 2K–2L illustrate a method of fabricating ramp-type junctions such as junctions 51 and 52, shown in FIGS. 1B and 1C.

Unconventional superconducting layer 20 and insulating layer 25 are deposited on substrate 5. A photoresist may then be deposited, for example by spin deposition, and subsequently patterned. The photoresist is exposed to form fixed portion 19e and unfixed portion 18e. The interface between photoresist 18e and 19e is distance R from the normal from the point of the surface where the edge of unconventional superconducting layer 20 should be. Because of the differing etch rates of the materials underlying the photoresist, junctions with a non-zero angle with the substrate normal will form, as shown in FIG. 2L. The bilayer is etched with ions 9 at an angle $A_3$ with the normal to the substrate. Photoresist 19e is then removed.

The method illustrated in FIGS. 2K and 2L can be applied to produce the hybrid structure of FIG. 1C by removing insulating layer 25 and increasing the areas of patterning for intermediate layer 21 and conventional superconductor 22.

In FIGS. 3–6 the heterojunctions shown in FIGS. 1A–1C are presented in a series of applications. FIGS. 3A–3B incorporate SND junctions 53, each of which may be any of junctions 50, 51, or 52. FIG. 3C incorporates an SID junction 54, which may be any of junctions 50, 51, or 52. The junctions 55 incorporated into FIGS. 4, 5A, and 5B may be either SID or SND junctions, and may be any of junctions 50, 51, or 52.

Figure 3A:
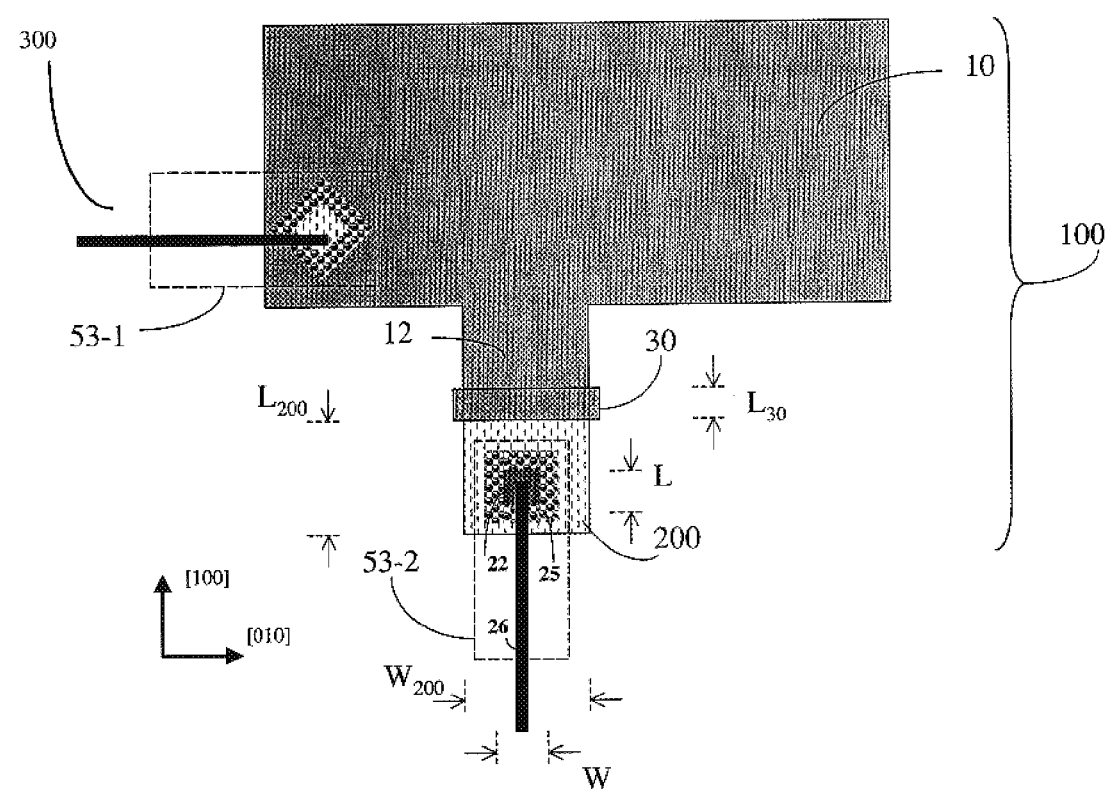
FIGS. 3A–3D illustrate PRSQ structures incorporating embodiments of the present invention.

FIG. 3A shows a quantum computing device 300 comprising a junction 53, which may be any of junctions 50, 51, or 52, affixed to a phase qubit 100, which comprises bank 10, junction 30 and island 200. Qubits are described in more detail in commonly assigned U.S. patent application Ser. No. 09/479,336 entitled "Qubit using a Josephson Junction between s-Wave and d-Wave Superconductors", filed Jan. 7, 2000; application Ser. No. 09/872,495 entitled "Quantum Processing System and Method for a Superconducting Phase Qubit", filed Jun. 1, 2001; and provisional Application Serial No. 60/316,134 entitled "Superconducting Low Inductance Qubit" filed Aug. 29, 2001, each of which is incorporated herein by reference. For illustrative purposes the phase qubit 100 is shown as a permanent readout superconducting qubit (PRSQ). A bank of superconducting material 10 has an optional finger 12. It is separated from a mesoscopic island 200 via a junction 30, which may be any of the junctions shown in FIGS. 1A–1C above, with length L30. The relative phase of bank 10 to island 200 forms the basis states of the phase qubit.

The phase qubit 100 could be any qubit that includes a micrometer sized loop with several Josephson junctions and a radio frequency SQUID. Alternatively qubit 100 could be a superconducting low inductance qubit (SLIQ). The SLIQ is a loop interrupted by one $\pi/2$ junction and two other Josephson junctions. As with a PRSQ its bit state is based on phase and is detected via differentiable antiparallel magnetic fields in the plane of the substrate.

Junctions 53-1 and 53-2 attached to island 200 and bank 10 are inverse (or reflected) trilayers with respect to each other. That is, if 53-1 is "SND", then 53-2 is "DNS", and vice versa. This is done because in the given example of the PRSQ, bank 10 may be formed of the same material as conventional superconductor 22, and island 200 may be formed of the same material as unconventional superconductor 20 of FIGS. 1A–1C. Embodiments of the PRSQ may additionally have the materials reversed.

Dimensions L and W of junction 53-2 correspond to length and width, respectively, as described hereinabove with respect to FIG. 1C, for example. The relative size of junction 53 and island 200 is not as drawn. Junction 53 need not be smaller than island 200. However, gross mismatch in size may not be desirable as the operational parameters will be dictated by the smaller of island 200 and junction 53.

Figure 3B:
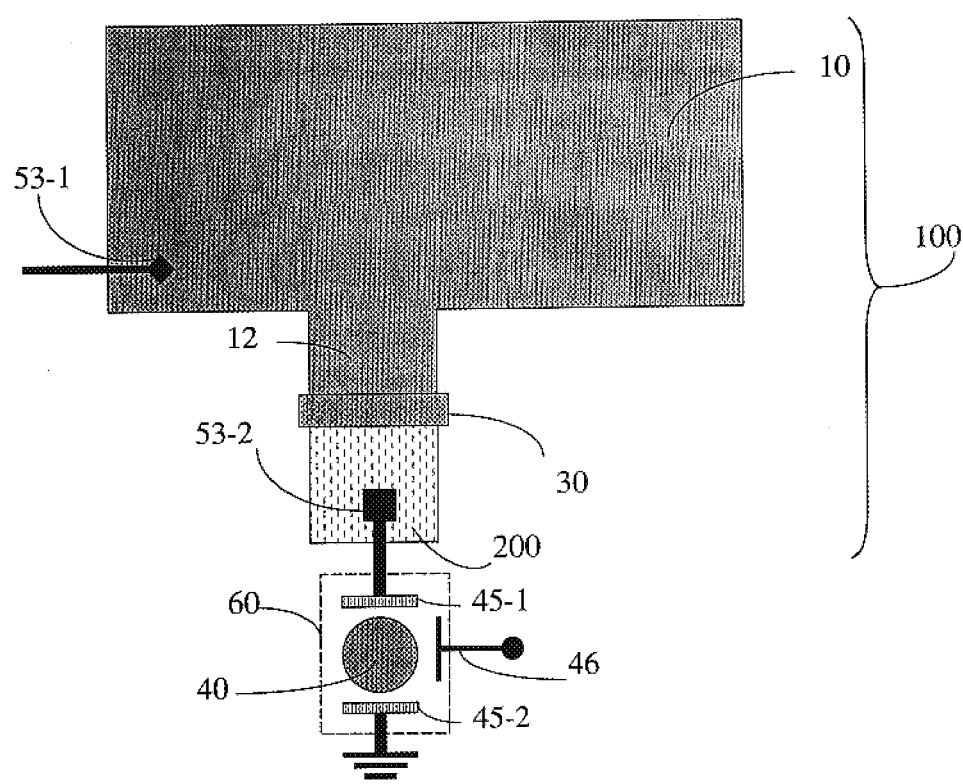

FIG. 3B shows a phase qubit 100 with an optional parity key 60 attached. One embodiment of a parity key is a superconducting single electron transistor (SET). SET's are well known and described, for example, by A. Zagoskin, *Quantum Theory of Many-Body Processes*, Springer-Verlag, (1997), which is incorporated herein by reference. SET's include an island 40 capacitively coupled to three devices, qubit island 200, gate electrode 46, and ground. An electron or Cooper pair can tunnel from island 200 onto island 40 when island 40 is uncharged. However, island 40 is small enough that once an electron or Cooper pair tunnels onto it, the charge of island 40 electrically repels and prevents further tunneling onto island 40. A gate 46 can change the voltage of island 40 to shut off or otherwise control the tunneling rate. SET's typically have a charge energy that is in excess of 10 times the Josephson energy. P. Joyez et al., *Phys. Rev. Lett.*, 72:15 (1994), which is incorporated herein by reference, describes operation and manufacture of one type of SET.

Parity key 60 is introduced as part of a control system optionally used to fix the state of a qubit or to create quantum entanglements between qubits. Fixing the state of a qubit is accomplished by connecting a qubit to ground, as illustrated in FIG. 3B. Creating entanglements between qubits can be accomplished by creating connections between qubits. Embodiments of the parity key can be made from a conventional superconductor or an unconventional superconductor, hence the need for a heterojunction connection between phase qubit 100 and parity key 60. Phase qubit island 200 may be made of unconventional superconductor, and parity key 60 may be made of a conventional superconductor, or vice versa. Thus, 100 can be labeled a SIS SET. This is done because the capacitive junction layer 30 is an insulating layer. Traversing from island 200 to ground, in FIG. 3B, one encounters the following order of materials DNSISIS. The SISIS structure is parity key 60. The middle S in "SISIS" is island 40 of the SET. The DNS structure is junction 53.

Figure 3C:
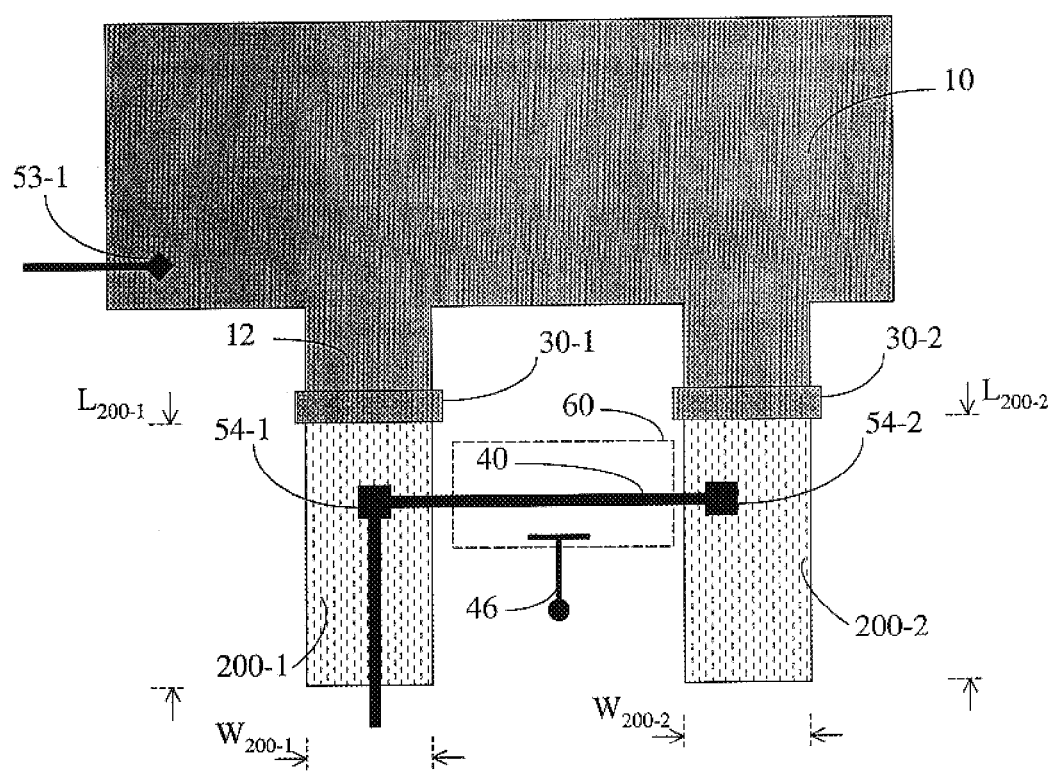

FIG. 3C introduces a DISID parity key 60 connecting two islands 200-1 and 200-2, thereby connecting two qubits. Heterojunctions 54 are affixed as described herein above. Island 40 of the SET is now the entire electrode that joins heterojunctions 54. The SET has a gate electrode 46. The acronym DISID is easy to deduce by traversing from island 200-1 through to island 200-2. Parity key 60 is comprised of island 40 and gate 46. Island 40 is a conventional superconducting material and is voltage biased, meaning that the current through the device is controlled by varying the voltage on electrode 46. The voltage level of electrode 46 determines whether any current flows, or whether quasiparticle or Cooper pairs flow. Alternatively, flux modulated switches can be employed. Flux modulated switches operate on the principle of using a flux that threads a loop to control current. See, for example, G. Schön, et al., *Rev. Mod. Phys.*, 73, 357–400, (2001), which is incorporated by reference.

In addition to the reduction in scale of the interface between island 200 and junction 54, detailed herein above, other dimensions are important to the operation of a qubit. The size of junction 54 is related to the consideration of the charging energy and Josephson energy, and their respective dependence on capacitance or transparency. The charging energy is inversely proportional to capacitance and hence area, while the Josephson energy is directly and independently proportional to transparency and area. The transparency of c-axis junctions, regardless of whether the junction is SID or SND, is very small. Therefore, it would be preferable to make the area of c-axis junctions slightly larger than a-b plane junctions. This yields a quadratic increase in the ratio of the Josephson energy to charging energy as a function of area. Too large a ratio is not useful for parity keys. Thus, the size of junctions 54 is not unbounded; there is an optimum area at which the charging energy is sufficient for the device to operate but where the Josephson energy is not so small that the device junction cannot function.

Careful consideration of the effect of affixing heterojunction 54 onto island 200 must be made. The size of junctions 54 is not unbounded because the dimensions of islands 200 are dictated by the embodiment of the PRSQ, and are preferably mesoscopic.

The major contribution to the capacitance of an island in a PRSQ comes from Josephson junction 30. In this respect, the relevant properties of Josephson junction 30 are determined by the width, $W_{200}$, of island 200, rather than its length, $L_{200}$, perpendicular to the junction. This is because the width affects the capacitance whereas the length does not. Thus the islands can be made narrower, while remaining long, thereby increasing the surface available for the c-axis junction. However, there is a limit on the length, above which the island is no longer mesoscopic, which depends on the embodiment. Furthermore, junctions of larger area will increase the capacitance and lower the charging energy of junction 54. Increasing the width of the Josephson junction can also have undesired effects on the operation of the qubit. In particular, the plasma frequency of the qubit will be reduced and its tunnel splitting between the basis states will decrease. A similar effect, but one that is smaller in magnitude, can arise from attaching an oversize junction 54 to island 200 because doing so will increase the capacitance of island 200 and will decrease its charging energy. This effect is especially noticeable for SID junctions.

Balancing all concerns, interface areas of island 200 and junction 54 of about 0.1 μm in width to about 0.5 μm or longer in length for a c-axis junction, and less for an a-b plane junction, are appropriate sizes for a PRSQ. The situation is less severe in the case of SND junctions, where the normal metal can be thicker, resulting in a lower capacitance.

Figure 3D:
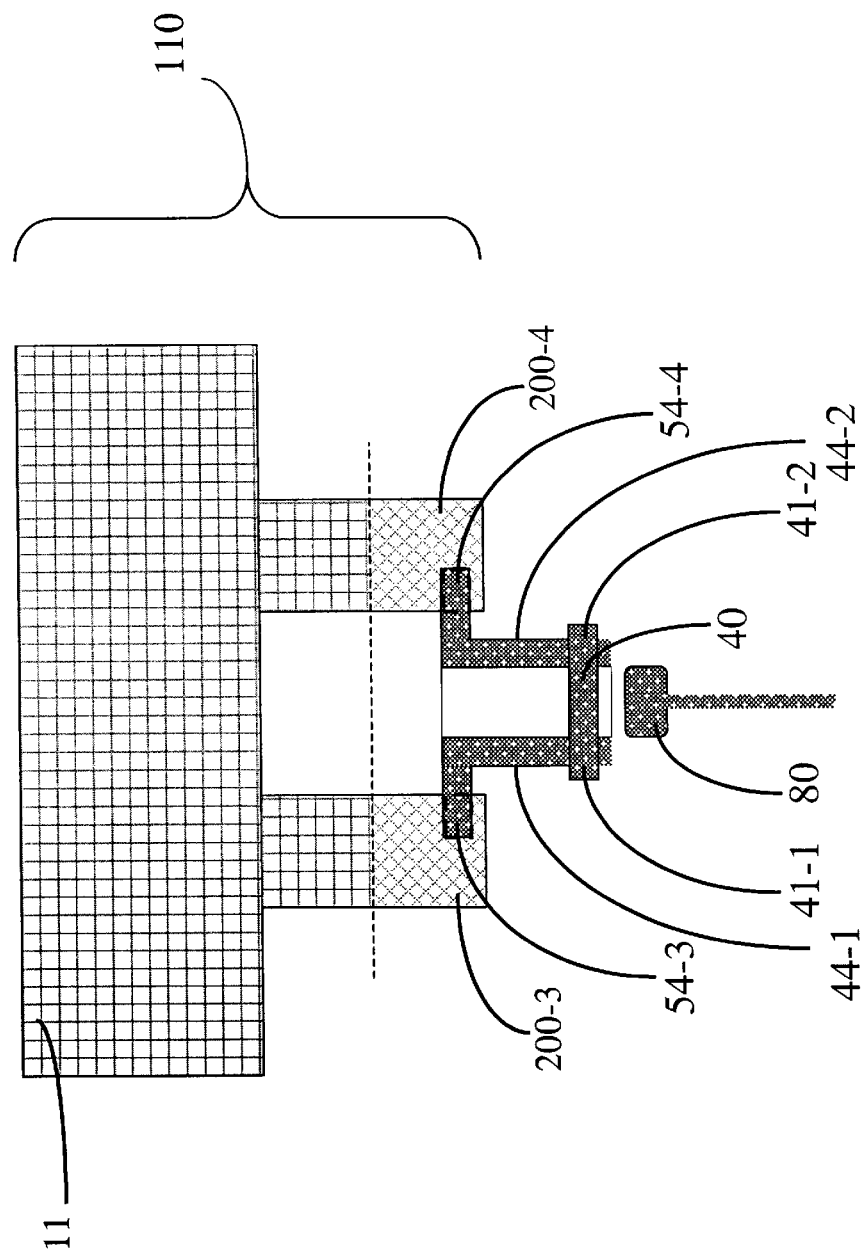

FIG. 3D illustrates another embodiment of a coupling between two mesoscopic islands, or alternatively the coupling between two superconducting qubits. Bank 11 can comprise part of a permanent readout superconducting qubit register 110. Register 110 is depicted in FIG. 3D as including two 0°–45° grain boundary Josephson junctions. Also depicted in FIG. 3D are two mesoscopic islands 200-3 and 200-4 that are situated across a grain boundary Josephson junction from a bank 11 of superconducting material. Both the islands 200-3 and 200-4 and the bank 11 can be unconventional superconducting material in accordance with examples found in U.S. patent application Ser. No. 09/452,749. Attached to each island 200-3 and 200-4 are interface junctions 54-3 and 54-4 respectively. Attached to each interface junction are superconducting material patterned as leads 44-1 and 44-2 that extend away from the permanent readout superconducting qubits. Overlying the leads are further Josephson junctions 41-1 and 41-2 and an island 40, which with electrode 80, comprise an example of a superconducting single electron transistor (SSET). Embodiments of the present invention include the use of unconventional superconducting material for both the leads and island 40. The deposition and patterning of a similar SSET (that does not have interface junctions 54-3 and 54-4) is described in D. Born, et al., "Fabrication of Ultra small Tunnel Junctions by Electron Beam Direct-Writing", *IEEE Transactions on Applied Superconductivity*, 11, 373–376, (2001).

The purpose of connecting qubits is to entangle them, thereby allowing for the wavefunctions of the individual qubits to overlap. Information may then be exchanged between qubits. The parity key with controllable single particle tunneling is an effective way to couple and de-couple qubits.

Figure 4A:
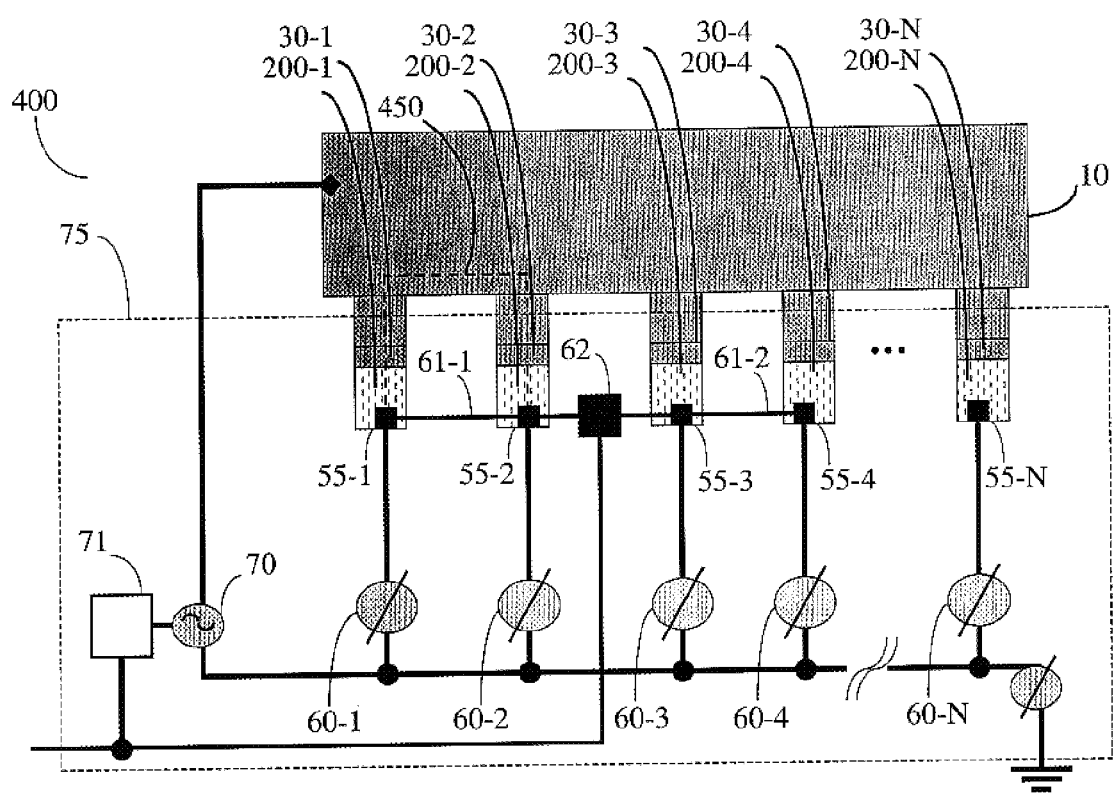
FIGS. 4A–4B illustrate multiple junctions in a quantum register.
Figure 4B:
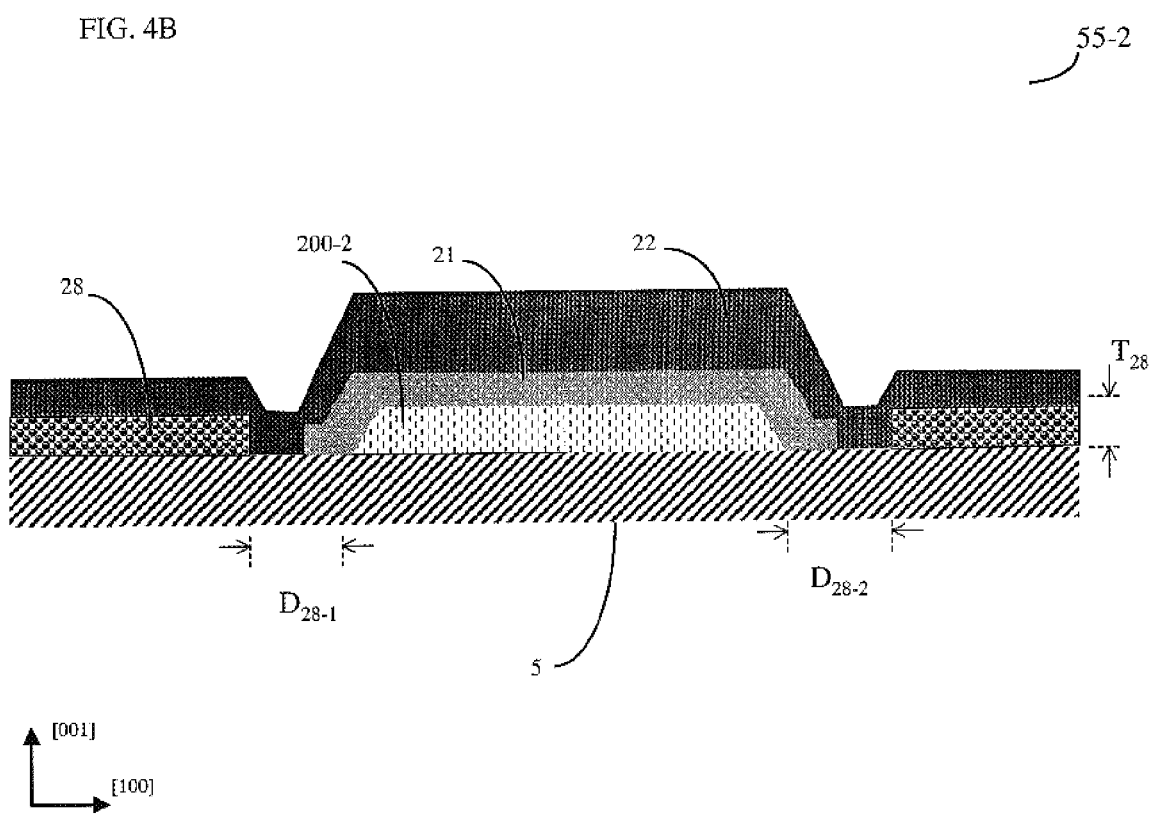

FIG. 4A shows embodiments of the invention as applied to a quantum register. FIG. 4B illustrates a cross section of island 200-2 of the device shown in FIG. 4A. The substrate to which junctions 55-2 and parity keys 60-2 are attached is island 200-2 of a PRSQ. Prior to the placement of the heterojunctions, an insulating layer 28 shown in FIG. 4B is formed over islands 200 and patterned to form a series of holes, denoted by the regions $D_{28-1}$ and $D_{28-2}$ in FIG. 4B. The intermediate layers 21 of junctions 55 are placed in the holes of the insulator, as illustrated in FIG. 4B.

In an embodiment of the invention, only a small region around each island 200 is exposed. Insulator 28 covers the rest of the substrate. Using the methods described hereinabove the exposed portion is filled with a normal material, followed by superconductor layer 22. Intermediate layer 21 may fill the hole in layer 28. Bistable Josephson junction 30-2 of register 400 is not in contact with layer 21. Furthermore, intermediate layer 21 has both its a-b plane and c-axis in contact with island 200-2. In an embodiment of the invention, intermediate layer 21 may be a normal metal.

A simple lead 61 may permanently connect two physical qubits creating one logical qubit. That is, the state of the logical qubit is encoded into the physical states of two physical qubits. Alternately, part of structure 400 of FIG. 4A can be used to create a single flux qubit, whereby loop 450 forms a single flux qubit. The junctions 55-1 and 55-2 can provide a coherent coupling between a first superconducting material 200 and a second superconducting material 61 for the passing of current and completion of the loop. Loop 450 can have a flux that can be readout by using a SQUID magnetometer for example, or any other flux qubit readout mechanism. The qubits of the quantum register can be linked to a control system similar to the one found in U.S. application Ser. No. 09/872,495, entitled "Quantum Processing System and Method for a Superconducting Phase Qubit", which is incorporated herein by reference. The major elements of such a control system are a means to bias the bank 10 through junctions 55 via a variable power source 70, a readout sensor 62, and a control system 71 connected to sensor 62 and power source 70, with leads off the register.

Figure 5A:
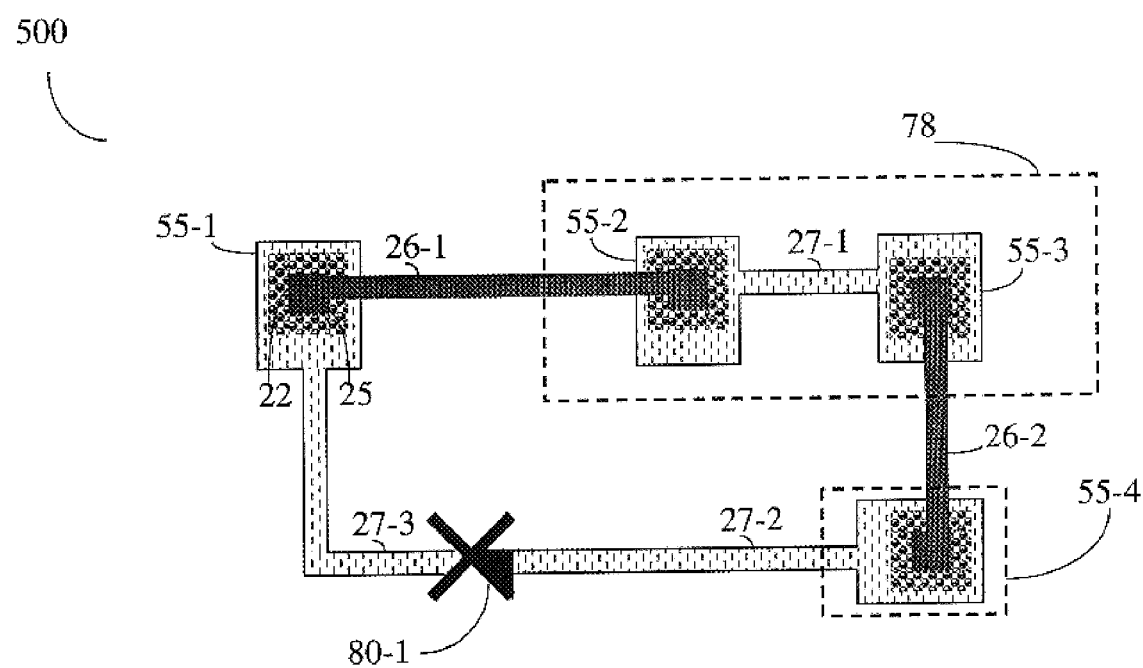
FIGS. 5A–5B illustrate even and odd numbers of junctions with a junction in a loop.

FIG. 5A shows a plan view of an even number of interface junctions connected by electrodes 26 and 27 to a Josephson junction 80. The placement of the insulator 25 separates electrodes 26 and 27. In some examples, electrodes 26 and 27 are in a vertical structure perpendicular to the plane of the figure, separated by a layer of insulator 25. Heterojunctions 55 may be added to this system in pairs 78. For simplification of discussion of this example, pair 78 is treated as a "black box", in this case as if it is single contiguous electrode 26. An equally valid example is to have any even number, such as 4, 6, 8, etc., of interface junctions in structure 78. The last component of system 500 is Josephson junction 80. Junction 80 can be a junction with a variable ground-state phase shift, $\Delta\psi$, across it ($0<\Delta\psi<\pi$) formed with unconventional superconducting material leads. Junction 80 could have the maximal ground state phase shift across it, i.e., $\pi$, or could have a phase shift of $\pi/2$. For an example of a $\pi$ junction see R. R. Schulz et al., *Appl. Phys. Lett.*, 76, 912, (2000), which is incorporated herein by reference. This can be accomplished in many ways. One way is to frustrate junction 80 by threading an external magnetic flux through the loop, as proposed by Mooij et al., *Science*, 285, 1036–1039, (1999), which is incorporated herein by reference. It is also possible to create a phase shift of $\pi/2$ by forming a 45° grain boundary junction by patterning an unconventional superconductor such as YBCO over a grain boundary of a bicrystal. There are other means to create junctions 80, such as biepitaxial methods, which allow for a variable phase shift by varying the degree of junction misorientation, see S. Nicoletti et al., *Physica C*, 269, 255, (1996), which is incorporated herein by reference.

Interface junctions can be formed to link a series of junctions with electrodes of alternating materials. The relative energies of the junctions can be made the same for the interface junctions 55 and much less for the junction 80. This would be done to avoid Aharonov-Casher interference effects that would occur in a loop in which junctions 55 and 80 all had the same Josephson energy, see Blatter et al., *Phys. Rev. B*, 63, 174511:1–7, (2001), which is incorporated herein by reference.

Figure 5B:
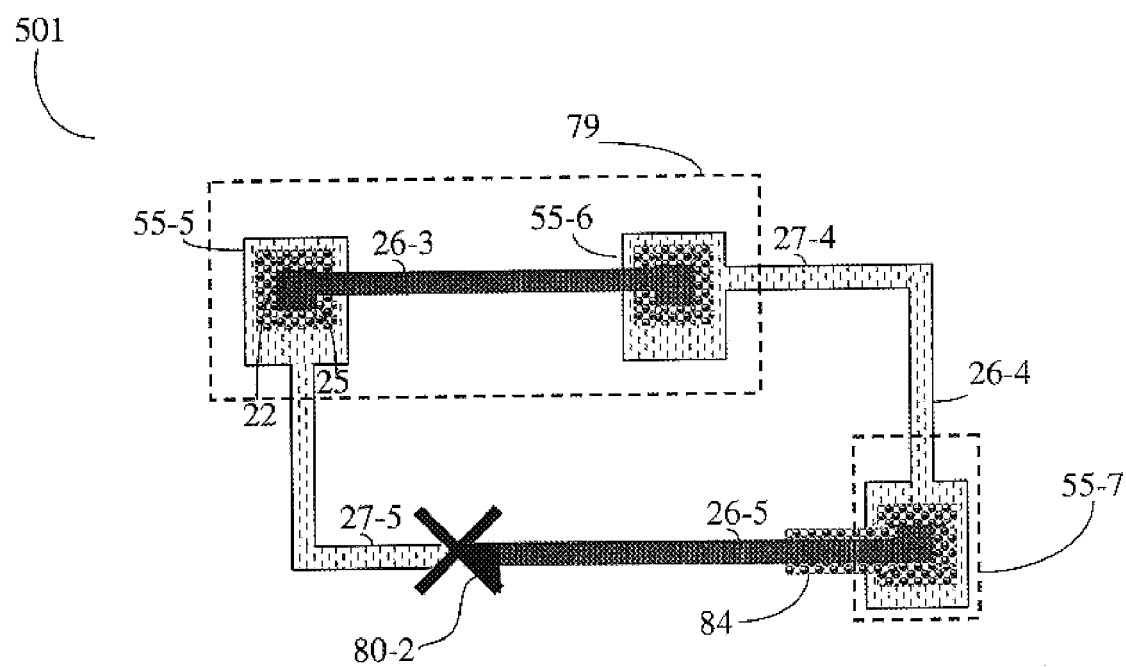

FIG. 5B shows the use of a insulating ramp 84 to yield an odd number of interface junctions placed in a loop with a junction 80. Ramp 84 can be a junction such as in FIG. 1B or FIG. 1C. In this example, junction 80 has two leads made of different types of superconductors: one of an unconventional superconductor and the other of a conventional superconductor. Ramp 84 is an insulator and allows electrode 27 from the base of pair 79 to become the top electrode 26 of heterojunction 55. The number of interface junctions 55 in pair 79 need only be even (or zero). The number of interface junctions in the loop 501 is odd. In some embodiments, junctions 55 of FIGS. 5A and 5B are SND c-axis junctions.

Figure 6A:
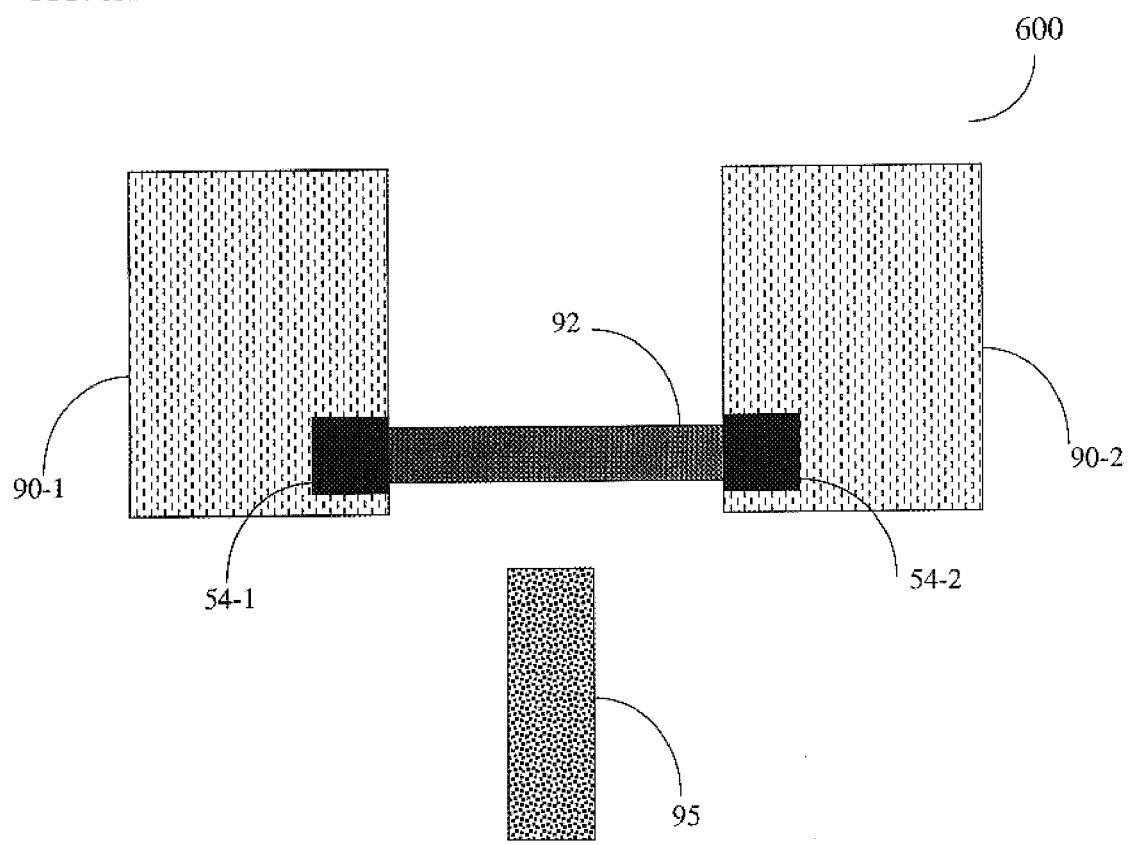
FIGS. 6A and 6B illustrate a coherent connection between two unconventional superconductors.

FIG. 6A illustrates, in plan view, a parity key 600 incorporating embodiments of the present invention. An example of a parity key is a SSET. A region of conventional superconductor 92 is coupled, via junctions 54-1 and 54-2, to two regions of unconventional superconductor 90-1 and 90-2. An optional gate electrode 95 is also shown which is capacitively coupled to 92. An appropriate combination of junction size and material used may create a coherent connection between unconventional regions 90-1 and 90-2. The conventional region 92 is generally of mesoscopic size to ensure phase coherency. Phase coherent, meaning phase preserving, transport between the regions 90-1 and 90-2 can be achieved by a parity key. In FIG. 6A, a superconducting single electron transistor includes junctions 54-1 and 54-2. These may be, for example, any of the junctions shown in FIGS. 1A–1C, and generally have an insulator or a combination of insulator and normal metal as an intermediate material between the conventional and unconventional superconductors. Embodiments of the present invention can include junctions 54-1 and 54-2 with a normal state resistance greater than about 13 k$\Omega$. It has been found that the value of the normal state resistance is important for SSET operation. Changes in the voltage on the electrode 95 induce a charge on the island, changing the ratio between the Coulomb energy $E_C$, and the Josephson energy $E_J$, such that the island permits the charge of a single charged particle to pass.

A voltage applied to gate 95 can alter the energy of conventional superconductor 92, allowing charge particles such as electrons and Cooper pairs to flow between unconventional regions 90-1 and 90-2. Changes in the voltage on the electrode 92 induce a charge on the island, changing the ratio between the Coulomb energy $E_c$, and the Josephson energy $E_J$, such that the island permits the charge of a single charged particle to pass. Optional gate electrode 95 need not be superconducting, but may be a conventional superconductor. The flow of Cooper pairs and electrons may be modulated by the application of different voltages to gate 95. The charging energy of conventional region 92 may also be controlled by controlling the capacitance of junctions 54-1 and 54-2, allowing Cooper pairs to flow in the absence of an applied voltage. The operation of a superconducting single electron transistor is described in Alexandre M. Zagoskin, *Quantum Theory of Many-Body Systems*, Springer, (1997).

Junctions 54-1 and 54-2 are formed from insulators or a mixture of insulator and normal metal as described hereinabove. Methods of etching to form an insulating region with the deposition of thin layer of normal metal as described hereinabove creates the appropriate junction with the correct charging to Josephson energy ratio. This is the preferred method but variations of the above methods will also yield suitable junctions. The junctions 54-1 and 54-2 are coherent and the particles tunneling through them will have the exact same phase. The island 91 of the parity key made from conventional superconducting material is deposited and patterned. The island is preferably of mesoscopic size to ensure phase coherency.

Figure 6B:
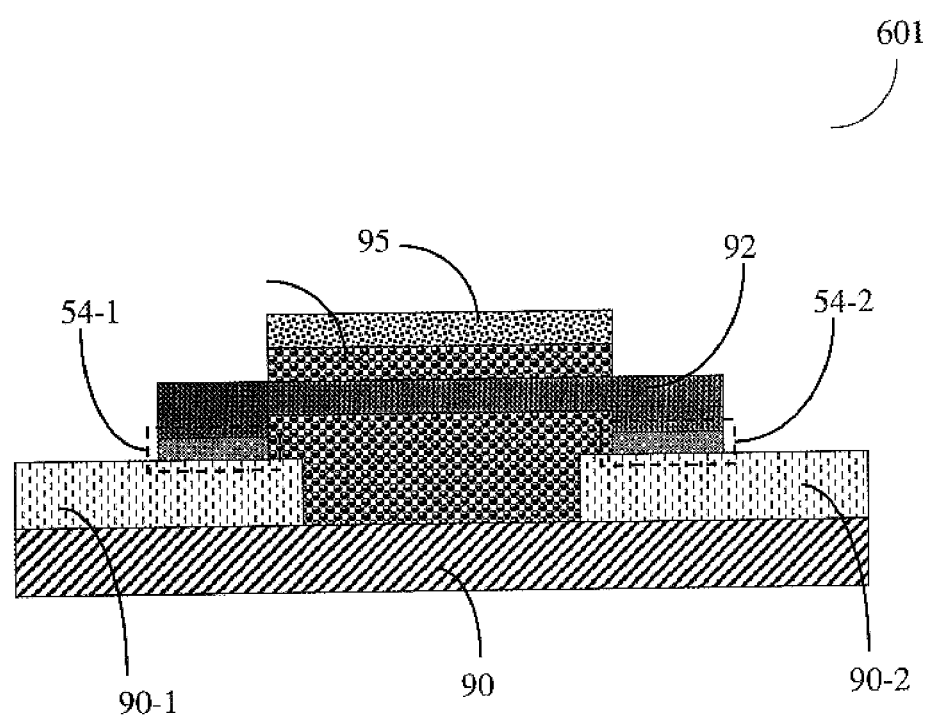

FIG. 6B shows a cross-section view of a parity key. An electrode 95 is placed over a part of the superconducting loop 92. This parity key can have applications to a variety of different structures. For example, structure 601 can be used to coherently couple two superconductors that violate time reversal symmetry. Such a device can be similar to a SET, wherein a voltage is coupled to a superconducting island, isolated between at least two Josephson junctions. Alternative embodiments of a parity key include a magnetic flux modulated dc-SQUID. The dc-SQUID can be introduced in a structure like 601 wherein the material 92 is fabricated as a SQUID structure placed in between 90-1 and 90-2. As is known to one of ordinary skill in the art, the current through a dc-SQUID is modulated via the magnetic flux that threads the loop of a dc-SQUID. The operation of such a device as a switch is detailed in Y. Makhlin, G. Schön, and A. Shnirman, "Quantum-State Engineering with Josephson-Junction Devices", *Reviews of Modern Physics*, 73, 357, (2001).

Changes in the voltage correlate with the charge on the island, changing the ratio between the Coulomb energy $E_c$, and the Josephson energy $E_J$, such that the island permits the charge of a single electron to pass. Furthermore, in some cases the SET can be tuned by varying the charge of the island to permit the charge of a single Cooper pair to pass. If the Josephson junctions that isolate the island do not introduce a phase to the Cooper pair as it passes through the device, then the SET can be considered coherent. The c-axis heterostructure junctions in the SLIQ structure are coherent tunnel junctions that allow the passing of supercurrent between an unconventional superconductor and a conventional superconductor. The second portion of the loop is isolated by the two c-axis tunnel junctions, and thus is an island, and the electrode provides a mechanism for capacitively coupling a voltage to the island, thus providing a mechanism for controlling the charge of the island. Thus, such a structure can become a coherent Cooper pair transistor, or generally a mechanism for controlled coupling of two unconventional superconductors.

It is well known that certain materials do not necessarily adhere well to one another thereby causing difficulty in creating high-quality structures. Nevertheless, YBCO, platinum and aluminum, in sequence, has been found to be an appropriate combination of materials for the layers of a trilayer junction in normal laboratory settings. In other settings, niobium has been found to be an effective substitute for aluminum. It is to be understood that these materials are provided as one selection of materials for the purpose of illustration, and embodiments of the present invention are not to be limited to these materials.

With respect to unconventional superconducting materials, embodiments of any device comprising a trilayer junction of the present invention can include the use of both high and low temperature superconducting materials. The high temperature superconductors $YBa_2Cu_3O_{7-x}$, $Bi_2Sr_2Ca_{n-1}Cu_nO_{2n+4}$, $Tl_2Ba_2CuO_{6+x}$, and $HgBa_2CuO_4$ are examples of unconventional superconducting material (that have dominant d-wave pairing symmetry) that can be used. In addition to high temperature superconducting material, some low temperature superconductors can be used. $Sr_2RuO_4$, or the heavy fermion material $CeIrIn_5$, are examples of unconventional superconducting material (that have dominant p-wave pairing symmetry) that can be used.

Embodiments of the present invention can include conventional superconducting material such as niobium, lead, and aluminum.

In embodiments of junctions of the present invention, when a normal conducting, though non-superconducting, metal is used in the intermediate material layer, it can be selected from the group consisting of: gold, silver, and palladium. In alternate embodiments, a metal can be used in the intermediate layer that is not superconducting under conditions of operation of the device, such as temperature, pressure, critical current and magnetic field. An example of such a metal is platinum.

Although the invention has been described with reference to particular embodiments, the description is only examples of the invention's applications and should not be taken as limiting. Various adaptations and combinations of features of the embodiments disclosed are within the scope of the invention as defined by the following claims

What is claimed is:

1. A Josephson junction comprising, in sequence:
   a first superconducting material layer;
   an intermediate layer having a first area of overlap with the first superconducting material layer; and
   a second superconducting material layer having a second area of overlap with the intermediate layer;
   wherein an area of intersection of the first area of overlap and the second area of overlap is less than or equal to about 0.1 $\mu m^2$, and wherein the first superconducting material layer is in contact with a substrate.

2. The Josephson junction of claim 1 wherein:
   the first superconducting material is a crystalline material having a crystal structure with an a-axis, a b-axis, and a c-axis; and
   the c-axis is normal to the substrate.

3. The Josephson junction of claim 2 wherein said crystal structure is orthorhombic and said c-axis is the largest lattice vector.

4. The Josephson junction of claim 1 wherein the area of intersection has a length of about 0.2 $\mu m$ and a width of about 0.1 $\mu m$.

5. The Josephson junction of claim 2 wherein:
   a first surface of the first superconducting material is parallel with said substrate; and
   a second surface of the first superconducting material makes an angle of inclination with a plane that is normal to the first surface, wherein the angle of inclination is measured in a sense exterior to said first superconducting material and wherein said first surface and said second surface share an edge.

6. The Josephson junction of claim 5 wherein the angle of inclination is between 0° and 90°.

7. The Josephson junction of claim 5 wherein the angle of inclination is about 30°.

8. The Josephson junction of claim 5 wherein:
   said intermediate layer makes said angle of inclination with a plane that is normal to the first surface and is parallel to the second surface of the first superconducting material; and
   said first area of overlap is measured with respect to said second surface of the first superconducting material.

9. The Josephson junction of claim 8 wherein:
   the second superconducting material layer makes said angle of inclination with a plane that is normal to the first surface and is parallel to both the second surface of the first superconducting material and the intermediate layer.

10. The Josephson junction of claim 1 wherein the area of intersection has length of about 0.5 $\mu m$ and a width of about 0.1 $\mu m$.

11. The Josephson junction of claim 1 wherein the b-axis of said first superconducting material is perpendicular to said edge.

12. The Josephson junction of claim 1 wherein said second superconducting material layer is in contact with said substrate.

13. The Josephson junction of claim 1 wherein the first superconducting material has a dominant anisotropic order parameter.

14. The Josephson junction of claim 1 wherein the first superconducting material has non zero angular momentum pairing.

15. The Josephson junction of claim 1 wherein the first superconducting material is a d-wave superconductor.

16. The Josephson junction of claim 1 wherein the first superconducting material is $YBa_2Cu_3O_x$.

17. The Josephson junction of claim 1 wherein the second superconducting material is an s-wave superconductor.

18. The Josephson junction of claim 1 wherein the second superconducting material is selected from the group consisting of lead, niobium, and aluminum.

19. The Josephson junction of claim 1 wherein the intermediate layer is a normal metal.

20. The Josephson junction of claim 1 wherein the intermediate layer is selected from the group consisting of gold, silver, platinum, and palladium.

21. The Josephson junction of claim 1 wherein the intermediate layer is an insulator.

22. The Josephson junction of claim 1 wherein the intermediate layer is a mixture of an insulator and normal metal.

23. The Josephson junction of claim 1 wherein the area of intersection is between about 0.01 $\mu m^2$ and about 0.1 $\mu m^2$.

24. The Josephson junction of claim 1 wherein the area of intersection is of mesoscopic size.

25. The Josephson junction of claim 1 wherein the first superconducting material layer has a thickness between about 75 nm and about 200 nm.

26. The Josephson junction of claim 1 wherein the second superconducting material layer has a thickness between about 100 nm and about 300 nm.

27. The Josephson junction of claim 1 wherein the intermediate layer has a thickness between about 1 nm and about 20 nm.

28. A superconducting structure comprising, in sequence:
    a substrate;
    a first superconducting material layer comprised of unconventional superconducting material and includes a first region and a second region wherein the first region is disjoint from the second region;
    an intermediate material layer; and
    a second superconducting material layer that includes an island, wherein the island has a first area of overlap with the first region and a second area of overlap with the second region of the first superconducting material layer;
    and wherein an electrode is capacitively coupled to said island so that supercurrent can flow coherently between said first region and said second region of said first superconducting material layer.

29. The superconducting structure of claim 28, wherein said first superconducting material layer has a dominant anisotropic order parameter.

30. The superconducting structure of claim 28, wherein said first superconducting material layer has non zero angular momentum pairing.

31. The superconducting structure of claim 30, wherein said first superconducting material layer is a d-wave superconductor.

32. The superconducting structure of claim 31, wherein said first superconducting material layer is selected from the group consisting of $YBa_2Cu_3O_x$, $Bi_2Sr_2Ca_{n-1}Cu_nO_{2n+4}$, $Tl_2Ba_2CuO_x$, and $HgBa_2CuO_4$.

33. The superconducting structure of claim 30, wherein said first superconducting material layer is selected from the group consisting of $Sr_2RuO_4$, and $CeIrIn_5$.

34. The superconducting structure of claim 28, wherein said second superconducting material layer is a conventional superconducting material.

35. The superconducting structure of claim 28, wherein said second superconducting material layer is an s-wave superconductor.

36. The superconducting structure of claim 34, wherein said second superconducting material layer is selected from the group consisting of aluminum, lead, and niobium.

37. The structure of claim 28, wherein the intermediate material is selected from the group consisting of a normal metal layer, a insulating material layer, and mixture of said normal and said insulating material layers.

38. The superconducting structure of claim 37, wherein said insulator material layer is in contact with said first superconducting material layer and said normal metal material layer.

39. The superconducting structure of claim 37, wherein said normal metal material layer is in contact with said insulator material layer and said second superconducting material layer.

40. The superconducting structure of claim 28, wherein said intermediate material layer includes material selected from the group consisting of gold, silver, palladium, and platinum.

41. The superconducting structure of claim 28, wherein said at least one island is mesoscopic.

42. The superconducting structure of claim 28, wherein the separation between said at least one electrode and said at least one island is less than 1 $\mu m$.

* * * * *